(12) United States Patent
Kim et al.

(10) Patent No.: US 7,269,782 B2
(45) Date of Patent: Sep. 11, 2007

(54) ORTHOGONAL FREQUENCY DIVISION MULTIPLEXING/MODULATION COMMUNICATION SYSTEM FOR IMPROVING ABILITY OF DATA TRANSMISSION AND METHOD THEREOF

(75) Inventors: Je-Woo Kim, Seongnam-shi (KR); Jong-Hyeon Park, Seoul (KR); Bok-Tae Shim, Seoul (KR); Si-Hyun Bae, Kyunggi-do (KR); Kyung-Sup Han, Kyunggi-do (KR)

(73) Assignee: TeleCIS Wireless, Inc., Santa Clara, CA (US)

( * ) Notice: Subject to any disclaimer, the term of this patent is extended or adjusted under 35 U.S.C. 154(b) by 0 days.

(21) Appl. No.: 11/392,438

(22) Filed: Mar. 28, 2006

(65) Prior Publication Data

US 2006/0184862 A1 Aug. 17, 2006

Related U.S. Application Data

(62) Division of application No. 10/106,084, filed on Mar. 26, 2002, now Pat. No. 7,028,246.

(30) Foreign Application Priority Data

Mar. 27, 2001 (KR) .............................. 2001-16019

(51) Int. Cl.
*H03M 13/00* (2006.01)

(52) U.S. Cl. ..................................................... 714/784

(58) Field of Classification Search ................ 714/746, 714/755, 780, 784, 792; 370/203, 342, 343, 370/344; 375/146, 260, 130, 147
See application file for complete search history.

(56) References Cited

U.S. PATENT DOCUMENTS 6,389,138 B1* 5/2002 Li et al. ........................ 380/35
6,535,066 B1* 3/2003 Petsko ......................... 330/285
6,618,367 B1* 9/2003 Riazi et al. .................. 370/347

* cited by examiner

*Primary Examiner*—James C Kerveros
(74) *Attorney, Agent, or Firm*—Blakely, Sokoloff, Taylor and Zafman

(57) ABSTRACT

An orthogonal frequency division multiplexing (OFDM) communication system and method for improving frequency utilization efficiency. In the system, a Reed-Solomon encoder codes input information data, and outputs a Reed-Solomon block having a second number of Reed-Solomon symbols each having a first number of Reed-Solomon symbol elements. An interleaver receives the Reed-Solomon block, and disperses the Reed-Solomon symbol elements existing in a specified one Reed-Solomon symbol within the received Reed-Solomon block in the same sub-channel positions in a fourth number of sub-channels of each of a third number of consecutive OFDM symbols.

11 Claims, 18 Drawing Sheets

ORTHOGONAL FREQUENCY DIVISION MULTIPLEXING/MODULATION COMMUNICATION SYSTEM FOR IMPROVING ABILITY OF DATA TRANSMISSION AND METHOD THEREOF

CROSS REFERENCE TO RELATED APPLICATIONS

This application is a divisional and claims the benefit of U.S. patent application Ser. No. 10/106,084, filed on Mar. 26, 2002, now U.S. Pat. No. 7,028,246 by Je-Woo Kim et al, entitled "ORTHOGONAL FREQUENCY DIVISION MULTIPLEXING/MODULATION COMMUNICATION SYSTEM FOR IMPROVING ABILITY OF DATA TRANSMISSION AND METHOD THEREOF", which claims priority to Korean patent application Serial No. 2001-16019, filed on Mar. 27, 2001, entitled "OFDM Communication System and Method for Improving Data Transmission Performance".

BACKGROUND OF THE INVENTION

1. Field of the Invention

The present invention relates generally to an OFDM (Orthogonal Frequency Division Multiplexing) scheme, and in particular, to an OFDM communication system and method for improving frequency utilization efficiency.

2. Description of the Related Art

An OFDM scheme recently used for high-speed data transmission over wired/wireless channels transmits data using multiple carriers. The OFDM scheme is a kind of an MCM (Multi-Carrier Modulation) scheme, which converts a serial input symbol stream to parallel symbol streams, and modulates the symbol streams with a plurality of orthogonal sub-carriers (or sub-channels) before transmission.

The MCM scheme was first applied to an HF (High Frequency) radio for military use in the late 1950's, and the OFDM scheme overlapping a plurality of orthogonal sub-carriers has been developed from 1970's. Since it is difficult to implement orthogonal modulation between multiple carriers, the application of the MCM and OFDM schemes to an actual system is limited. However, since Weinstein et al. announced in 1971 that OFDM modulation/demodulation could be efficiently processed using DFT (Discrete Fourier Transform), the technical development of the OFDM scheme has made rapid progress. In addition, as the use of a guard interval and a method of inserting a cyclic prefix guard interval are known, the negative effects of the system on multiple paths and delay spread have decreased further. Therefore, the OFDM scheme is widely applied to the digital transmission technologies such as digital audio broadcasting (DAB), digital television, wireless local area network (WLAN), and wireless asynchronous transfer mode (WATM). That is, although the OFDM scheme was not widely used due to its hardware complexity, recent development of various digital signal processing technologies including fast Fourier transform (FFT) and inverse fast Fourier transform (IFFT) makes it possible to implement the OFDM scheme. Though similar to the conventional FDM (Frequency Division Multiplexing) scheme, the OFDM scheme is characterized in that it can obtain optimal transmission efficiency during high-speed data transmission by maintaining orthogonality among a plurality of sub-carriers. In addition, the OFDM scheme has excellent frequency efficiency and is resistant to multi-path fading, thus making it possible to obtain optimal transmission efficiency during high-speed data transmission. Further, since the OFDM scheme uses overlapped frequency spectrums, it has excellent frequency utilization efficiency, is resistant to frequency selective fading, is resistant to multi-path fading, can reduce the effects of ISI (Inter-Symbol Interference) using the guard interval, can simply design the hardware structure of an equalizer, and is resistant to impulse noises. Hence, the OFDM scheme tends to be actively applied to the communication system.

Now, a structure of a common OFDM system is described with reference to FIG. 1.

FIG. 1 illustrates a structure of an OFDM system according to the prior art. Referring to FIG. 1, received information data 101 is provided to an error correction encoder 102. The error correction encoder 102 codes the received information data 101 using error correction coding previously set in the OFDM system, i.e., Reed-Solomon coding, and provides its output to an interleaver 103. The interleaver 103 interleaves the output signal of the encoder 102 for preventing burst errors, and provides its output to a serial-to-parallel (S/P) converter 104. The S/P converter 104 forms a plurality of sub-channels by arranging serial data output from the interleaver 103 in the form of parallel data, and provides the sub-channels to a pilot adder 106. The pilot adder 106, under the control of a pilot controller 105, adds pilots to the sub-channels output from the S/P converter 104, and provides the pilot-added sub-channels to a sub-channel mapper 107. Here, the pilot controller 105 generates pilot data blocks by phase-shifting a plurality of pilot data blocks previously set in the OFDM system with a random code. The pilot adder 106 adds the pilot data blocks generated by the pilot controller 105 to the pilot sub-channels, and outputs K sub-channels [C(1), C(2), ..., C(K)] along with a plurality of sub-channels.

The sub-channel mapper 107 performs signal-mapping on constellation for the K sub-channels output from the pilot adder 106, and outputs signal-mapped sub-channels [S(1), S(2), ..., S(K)]. Here, the signal mapping may be performed according to BPSK (Binary Phase Shift Keying), QPSK (Quadrature Phase Shift Keying), 16QAM (16-ary Quadrature Amplitude Modulation) or 64QAM modulation. The signal-mapped signals [S(1), S(2), ..., S(K)] output from the sub-channel mapper 107 are provided to an inverse fast Fourier transformer (IFFT) 108. Here, the IFFT 108, a K-point inverse fast Fourier transformer, OFDM-multiplexes the signals output from the sub-channel mapper 107 and provides the OFDM-multiplexed signals [s(1), s(2), ..., s(K)] to a parallel-to-serial (P/S) converter 109. The P/S converter 109 converts the OFDM-multiplexed signals [s(1), s(2), ..., s(K)] in the form of parallel data output from the IFFT 108 into a serial signal, and outputs the serial signal as output data 110.

Compared with other systems, the OFDM system having the structure described in conjunction with FIG. 1 has excellent frequency utilization efficiency and is resistant to multi-path fading and frequency selective fading. However, there is a need for an OFDM system having more excellent frequency utilization efficiency and is more resistant to the multi-path fading and frequency selective fading.

BRIEF SUMMARY OF THE INVENTION

It is, therefore, an object of the present invention to provide an interleaving apparatus and method for improving transmission error performance on Reed-Solomon coded symbols.

It is another object of the present invention to provide a sub-channel repetition apparatus and method for improving transmission error performance by repeatedly transmitting the same data over a plurality of different sub-channels.

It is further another object of the present invention to provide a sub-channel repetition apparatus and method for removing frequency selective fading.

It is yet another object of the present invention to provide a sub-channel assignment apparatus and method for acquiring frequency diversity using sub-channel frequency transition.

It is still another object of the present invention to provide an apparatus and method for transmitting sub-channels having a minimized PAPR (Peak-to-Average Power Ratio).

It is still another object of the present invention to provide an apparatus and method for detecting transmitted sub-channels having a minimized PAPR without using separate supplemental information.

It is still another object of the present invention to provide a system and method for acquiring antenna diversity.

In accordance with a first aspect of the present invention, there is provided a system for improving error correction capability in an OFDM (Orthogonal Frequency Division Multiplexing) communication system. The system comprises a Reed-Solomon encoder for coding input information data, and outputting a Reed-Solomon block comprised of a second number of Reed-Solomon symbols each comprised of a first number of Reed-Solomon symbol elements; and an interleaver for receiving the Reed-Solomon block, and dispersing the Reed-Solomon symbol elements existing in a specified one Reed-Solomon symbol within the received Reed-Solomon block in the same sub-channel positions in a fourth number of sub-channels of each of a third number of consecutive OFDM symbols.

In accordance with a second aspect of the present invention, there is provided a system for repeatedly transmitting sub-channels in an OFDM communication system. The system comprises a sub-channel repeater for repeating input data blocks so as to transmit each of the input data blocks over a predetermined number of sub-channels; and a plurality of mappers for mapping the sub-channels output from the sub-channel repeater according to a predetermined modulation mode.

In accordance with a third aspect of the present invention, there is provided a system for performing sub-channel assignment in an OFDM communication system. The system comprises a plurality of selectors for selecting a specific sub-channel data block among input sub-channel data blocks according to a control signal, and transmitting the selected sub-channel data block over a corresponding sub-channel; and a sub-channel assignment controller for controlling sub-channel assignment such that each of the selectors converts a sub-channel data block to be selected from the sub-channel data blocks in a predetermined period of time.

In accordance with a fourth aspect of the present invention, there is provided a system for transmitting sub-channels having a minimum PAPR (Peak-to-Average Power Ratio) in on OFDM communication system. The system comprises a pilot scrambling code generator for generating a predetermined number of pilot scrambling codes for identifying pilot sub-channel data blocks among input sub-channel data blocks; a scrambling code generator for generating a predetermined number of scrambling codes for scrambling the input sub-channel data blocks; a plurality of first multipliers for multiplying the input pilot sub-channel data blocks by a first pilot scrambling code among the pilot scrambling codes, for scrambling; a plurality of second multipliers for multiplying the sub-channel data blocks excluding the pilot sub-channel data blocks from the input sub-channel data blocks and data blocks output from the first multipliers by a first scrambling code among the scrambling codes, for scrambling; a first inverse fast Fourier transformer (IFFT) for IFFT-transforming the signals output from the second multipliers; a plurality of third multipliers for multiplying the input pilot sub-channel data blocks by a second pilot scrambling code among the pilot scrambling codes, for scrambling; a plurality of fourth multipliers for multiplying the sub-channel data blocks excluding the pilot sub-channel data blocks from the input sub-channel data blocks and data blocks output from the third multipliers by a second scrambling code among the scrambling codes, for scrambling; a second IFFT for IFFT-transforming the signals output from the fourth multipliers; first and second PAPR calculators for calculating PAPRs of the sub-channel data blocks output from the first IFFT and the second IFFT, respectively; and a selector for selecting sub-channel data blocks output from the first and second IFFTs having a minimum PAPR among the calculated PAPRS, and transmitting the selected sub-channel data blocks over a sub-channel of the OFDM communication system.

In accordance with a fifth aspect of the present invention, there is provided a transmission system employing transmission antenna diversity in an OFDM communication system. The system comprises a first antenna for transmitting an in-phase signal having no phase offset with output data, upon receiving the output data; and a second antenna for alternately transmitting the received output data as an in-phase signal having no phase offset with the output data and as a phase-inversed signal having a 180 degree phase offset with the output data in a training symbol period.

BRIEF DESCRIPTIONS OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
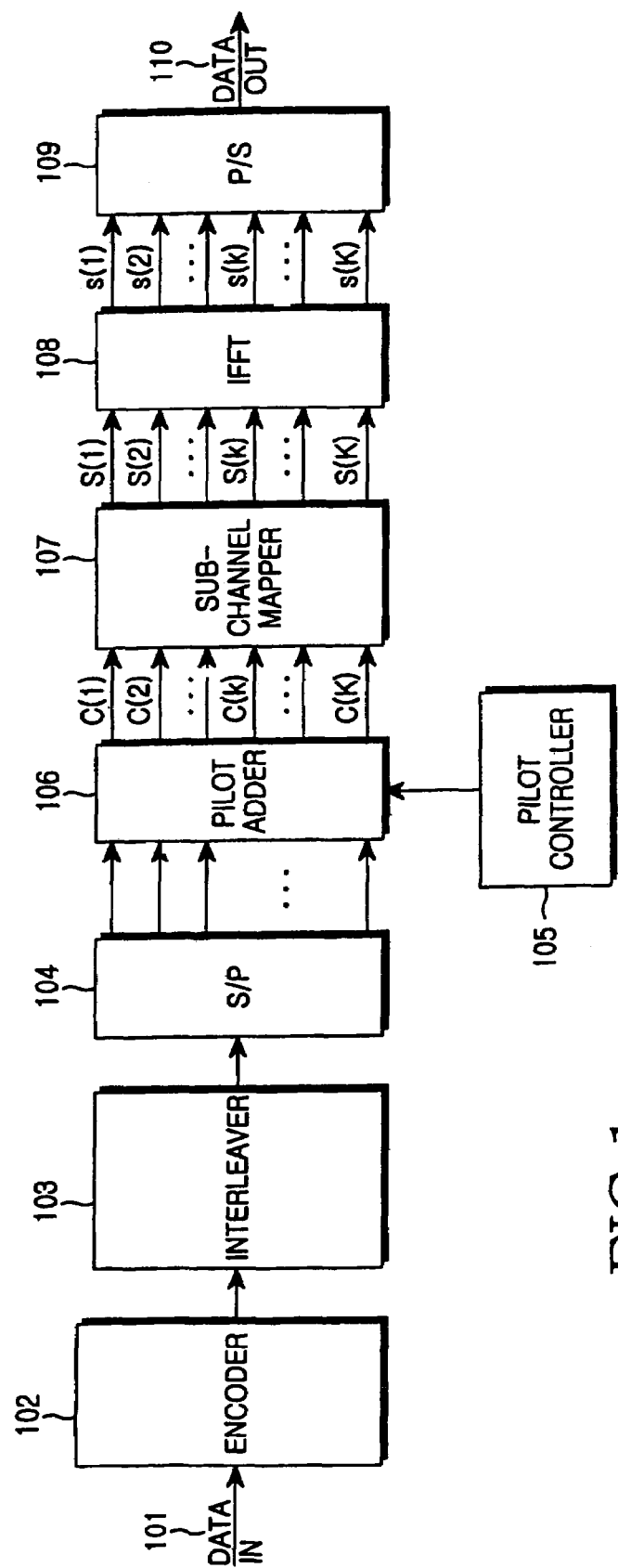
FIG. 1 illustrates a structure of an OFDM system according to the prior art.

A preferred embodiment of the present invention will be described herein below with reference to the accompanying drawings. In the following description, well-known functions or constructions are not described in detail since they would obscure the invention in unnecessary detail.

The present invention provides five embodiments for improving OFDM communication performance, i.e., the frequency utilization efficiency and the multi-path fading characteristic. A brief description of the five embodiments will be given below.

(1) First Embodiment

The first embodiment proposes an interleaving apparatus and method for improving system performance by improving error correction performance of the OFDM system, when the OFDM system codes transmission information data by Reed-Solomon coding. The first embodiment interleaves/deinterleaves data symbols such that a group of error (or damaged) data blocks is arranged in a specified one of Reed-Solomon coded symbols. That is, this embodiment improves error correction capability for the frequency selective fading by performing interleaving and deinterleaving such that respective data blocks in one Reed-Solomon symbol should be mapped to the same sub-channels in a plurality of OFDM symbols.

(2) Second Embodiment

The second embodiment provides an apparatus and method for performing repetitive transmission on a plurality of different OFDM sub-channels in the OFDM system. By performing repetitive transmission on the sub-channels, it is possible to acquire frequency diversity. Hence, the OFDM system provides reliable data communication even in a frequency selective fading environment or a poor environment where an intended/non-intended interference signals exist. Further, it is possible to perform channel mapping such that during repetitive transmission, the associated sub-channels vary depending on the time, thus acquiring additional frequency diversity.

(3) Third Embodiment

The third embodiment provides a scheme for dynamically performing OFDM sub-channel assignment according to a predetermined code pattern or a pattern previously set in the OFDM system depending on the time, rather than statically performing sub-channel mapping, or adaptively performing the sub-channel assignment according to the channel condition. Since the sub-channel frequency is not static but dynamic, it is possible to acquire frequency diversity.

(4) Fourth Embodiment

The fourth embodiment provides a method for detecting a selected sub-channel with the minimized PAPR (Peak-to-Average Power Ratio) using a plurality of scrambling codes at a receiver, without transmitting separate supplemental information at a transmitter in the OFDM system. The minimization of the PAPR reduces a load of a power amplifier (PA) in the transmitter, making it possible to readily implement the power amplifier. In addition, the method according to the fourth embodiment of the present invention performs IFFT (Inverse Fast Fourier Transform) by scrambling transmission data using a plurality of predetermined codes (complementary codes in this embodiment) by the transmitter, and selecting the sub-channel having the minimum PAPR. In the prior art scheme, the transmitter transmits transmission data along with supplemental information for the scrambling code having minimum PAPR, so that the receiver detects the supplemental information. However, in the embodiment of the present invention, even though the transmitter does not transmit the supplemental information for the scrambling code, the receiver can detect the sub-channel selected by the transmitter, thus contributing to simplification of the hardware structure of the transceiver. Further, since it is not necessary to transmit the supplemental information, additional overhead is not required.

(5) Fifth Embodiment

The fifth embodiment provides a scheme for implementing transmission antenna diversity for alternating phases in a training symbol period so that the receiver can estimate the characteristics of different transmission channels when diversity is applied to the transmission antennas. In the fifth embodiment of the present invention, the OFDM system having a plurality of transmission antennas, e.g., 2 transmission antennas, transmits an in-phase signal (of 0 degree phase) with a first antenna, and alternately transmits signals with a second antenna in the training symbol period. That is, the OFDM system first transmits an in-phase signal (of 0 degree phase) and next transmits a phase-inversed signal (of 180 degree phase). Accordingly, the receiver can perform channel estimation on the respective transmission paths used by the transmitter in transmitting the signals through the two antennas, and performs data processing and demodulation using the estimation results on the respective transmission channels, thus improving system performance.

A detailed description of the first to fifth embodiments will be made with reference to the accompanying drawings.

Figure 2:
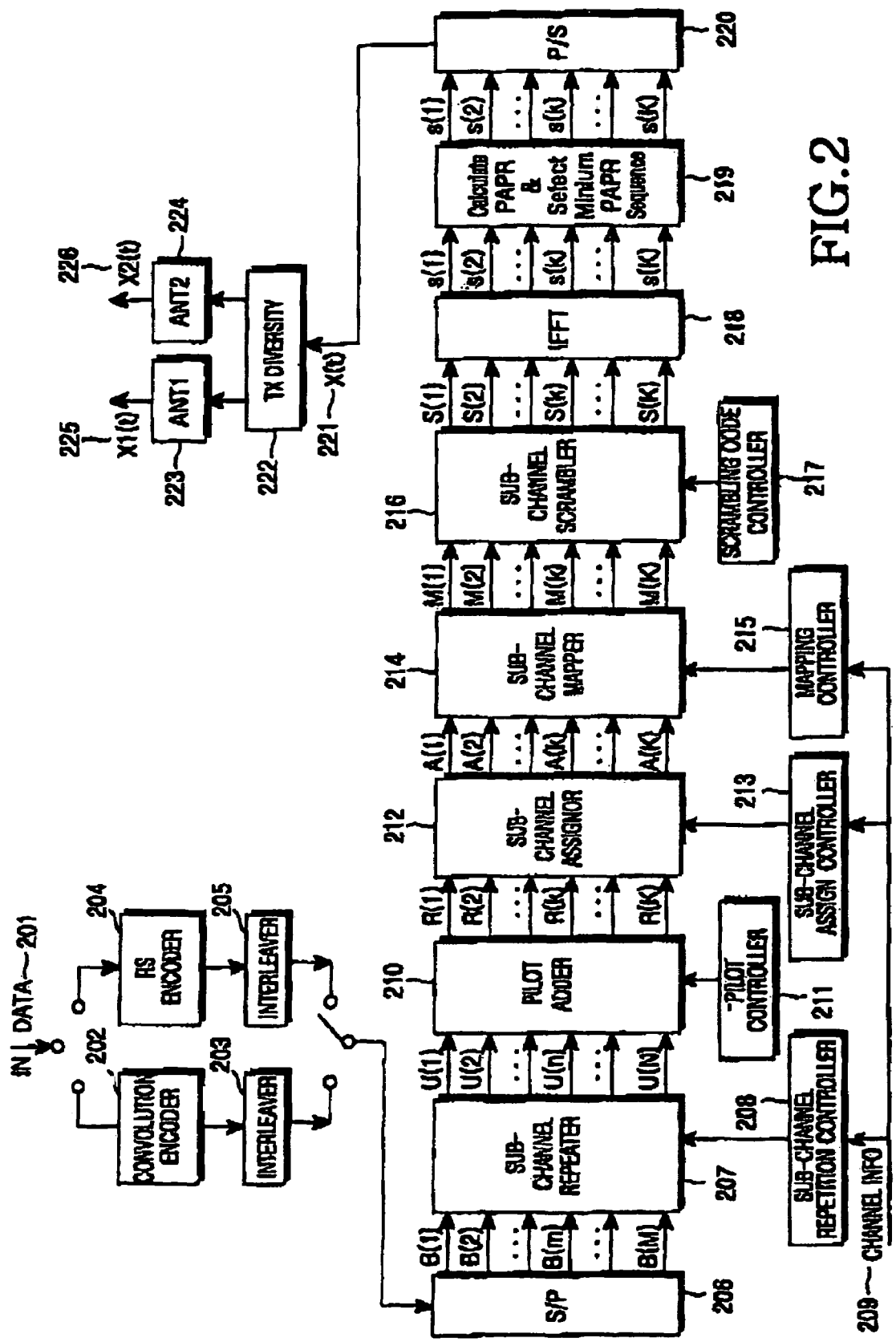
FIG. 2 illustrates a structure of an OFDM system performing a function according to an embodiment of the present invention.

FIG. 2 illustrates a structure of an OFDM system performing a function according to an embodiment of the present invention. Referring to FIG. 2, input transmission information data 201 is switched to a convolutional encoder 202 according to a control signal. The convolutional encoder 202 convolutional-codes the input information data 201, and provides its output to an interleaver 203. The interleaver 203 interleaves the signal output from the convolutional encoder 202 according to a preset interleaving rule, and provides its output to an S/P converter 206. Of course, although the input information data 201 can be subject to convolutional coding, the embodiment of the present invention will be described on the assumption that the input information data 201 is subject to Reed-Solomon coding. Then, the input information data 201 is provided to a Reed-Solomon (RS) encoder 204 under the control of the OFDM system. The Reed-Solomon encoder 204 performs Reed-Solomon coding on the input information data 201, and provides its output to an interleaver 205. The interleaver 205 interleaves the signal output from the Reed-Solomon encoder 204 using an interleaving rule based on the first embodiment of the present invention, and provides its output to the S/P converter 206. The interleaving rule based on the first embodiment, especially an interleaving rule for the Reed-Solomon coded data symbols will be described later with reference to FIGS. 3 to 8.

The S/P converter 206 converts the interleaved signal in the form of a serial signal into M parallel signals, i.e., parallel signals comprised of a plurality of sub-channels, and provides its output to a sub-channel repeater 207. A sub-channel repetition operation of the sub-channel repeater 207 is controlled by a repetition controller 208, and the repetition controller 208 controls the repetitive transmission using channel information 209. A detailed description of the sub-channel repeater 207 and the repetition controller 208 according to the embodiment of the present invention will be given later with reference to FIGS. 9 to 11.

The sub-channel repeated signals are provided to a pilot adder 210. The pilot adder 210, under the control of a pilot controller 211, adds pilot sub-channels to the signals output from the sub-channel repeater 207, and provides its output to a sub-channel assignor 212. The sub-channel assignor 212, under the control of a sub-channel assignment controller 213, receives the signals output from the pilot adder 210 and dynamically adaptively assigns the OFDM sub-channels by varying the sub-channels according to the set time or the service type, rather than statically assigning the sub-channels. The sub-channel assignment controller 213 controls the dynamic/adaptive sub-channel assignment according to the channel condition, using the channel information 209. A detailed description of the sub-channel assignor 212 and the sub-channel assignment controller 213 will be made later with reference to FIGS. 12A to 13.

The sub-channel signals output from the sub-channel assignor 212 are provided to a sub-channel mapper 214. The sub-channel mapper 214, under the control of a mapping controller 215, performs mapping for modulation of the respective sub-channels according to a modulation mode determined based on a data rate, and provides the mapped signals to a sub-channel scrambler 216. Here, the signal mapping may be performed according to BPSK, QPSK, 16QAM or 64QAM modulation. The sub-channel scrambler 216 scrambles the signals output from the sub-channel mapper 214 with a scrambling code generated by a scrambling code controller 217, and provides the scrambled signals to an inverse fast Fourier transformer (IFFT) 218. Here, the sub-channel scrambler 216 and the scrambling code controller 217 scramble each OFDM symbol data block by several scrambling codes, rather than simply scrambling the sub-channels, and then provide the scrambled data blocks to the IFFT 218. Although the OFDM system of FIG. 2 includes a single IFFT 218, the OFDM system may include as many IFFTs as the number of scrambling codes, when a plurality of scrambling codes are used. Such a structure will be described later with reference to FIGS. 14 and 15. The IFFT-transformed sub-channels are provided to a PAPR calculator & minimum PAPR sub-channel selector 219. The PAPR calculator & minimum PAPR sub-channel selector 219 receives the signals output from the IFFT 218, calculates PAPRs of the received signals, and selects the IFFT-transformed signal having the minimum PAPR among the IFFT-transformed signals output from the IFFT 218. The IFFT 218 provides the sub-channels corresponding to the selected IFFT-transformed signal having the minimum PAPR to a P/S converter 220. That is, the OFDM system scrambles each OFDM symbol data block with different scrambling codes, subjects the scrambled signals to IFFT, and selects a sequence having minimum PAPR from the IFFT-transformed signals. The embodiment of the present invention provides a scrambling scheme for reducing the PAPR. In this scrambling scheme, even though the transmitter does not transmit separate supplemental information on the scrambling code used by the transmitter itself, the receiver can detect the corresponding sequence using only the pilot sub-channel. This scrambling scheme will be described in detail with reference to FIGS. 14 and 15.

The P/S converter 220 converts the parallel sub-channel signals output from the PAPR calculator & minimum PAPR sub-channel selector 219 into a serial signal X(t). The signal output from the P/S converter 220 is provided to a transmission diversity device 222. The transmission diversity device 222 performs transmission diversity to transmit the serial signal X(t) through a plurality of antennas, e.g., 2 antennas. When transmitting the transmission signal using the two transmission antennas, the transmission diversity device 222 transmits an in-phase signal (0 degree phase) with a first antenna, and alternately transmits signals with a second antenna in the training symbol period. That is, the transmission diversity device 222 first transmits an in-phase signal (0 degree phase) and next transmits a phase-inversed signal (180 degree phase). As a result, a first transmission diversity signal $X_1(t)$ is transmitted through a first antenna ANT1 (223), while a second transmission diversity signal $X_2(t)$ is transmitted through a second antenna ANT2 (224). A transmission diversity scheme of the transmission diversity device 222 according to the embodiment of the present invention will be described in detail with reference to FIG. 16.

Next, a detailed description will be made of the embodiments of the present invention in the OFDM system having the structure described in conjunction with FIG. 2.

First, a description of a scheme for interleaving the Reed-Solomon coded symbol data will be made with reference to FIGS. 3 to 8.

Figure 3:
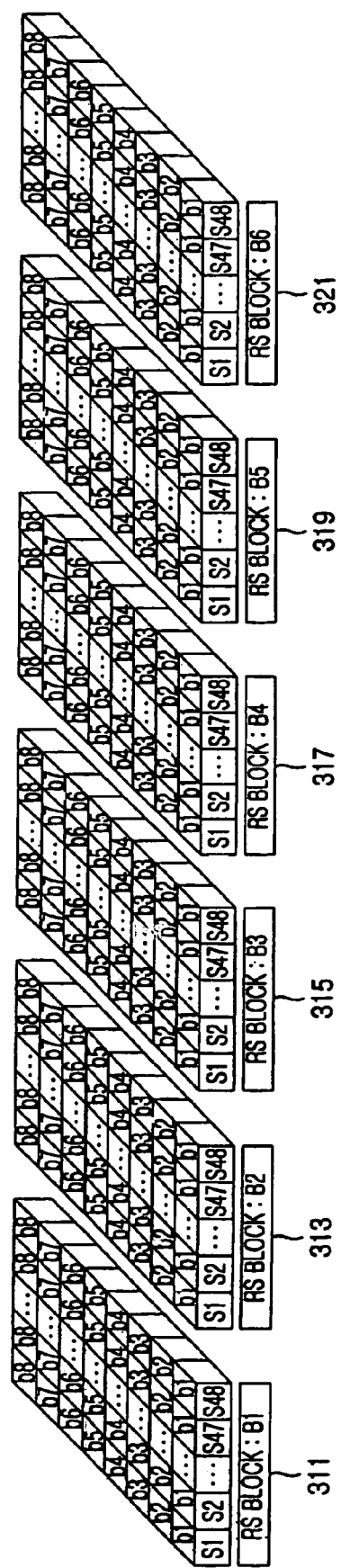
FIG. 3 illustrates a structure of Reed-Solomon coded data symbols according to an embodiment of the present invention.

FIG. 3 illustrates a structure of Reed-Solomon coded data symbols according to an embodiment of the present invention. As described in conjunction with FIG. 2, the OFDM system employing Reed-Solomon coding should arrange Reed-Solomon coded symbol elements in the sub-channels located in the same positions of the OFDM symbols, in order to improve error correction capability of the system. By deinterleaving the OFDM symbols interleaved in this manner, the receiver arranges the error (or damaged) data on the transmission channel in one Reed-Solomon symbol of the Reed-Solomon decoder, thus making it possible to improve error correction capability. Particularly, in a frequency selective fading environment, it is possible to further improve the error correction capability.

The data symbol structure based on the Reed-Solomon coding, shown in FIG. 3, is an output of the Reed-Solomon encoder 204 having GF(28), k Reed-Solomon input symbols, n=48 Reed-Solomon output symbols, and error correction capability of t=(n−k)/2. The output of the Reed-Solomon encoder 204 can be defined as $$GF(28), (n, k, t) = \left(48, k, \frac{(n-k)}{2}\right)$$

Each of Reed-Solomon (RS) blocks [B1, B2, . . . , B6] 311-321 is comprised of 48 Reed-Solomon symbols [S1, S2, . . . , S48], and since GF(2**8) is used, each Reed-Solomon symbol is comprised of 8 Reed-Solomon elements [b1, b2, . . . , b8]. The output of the Reed-Solomon encoder 204 having this structure is provided to the interleaver 205 illustrated in FIG. 4.

Figure 4:
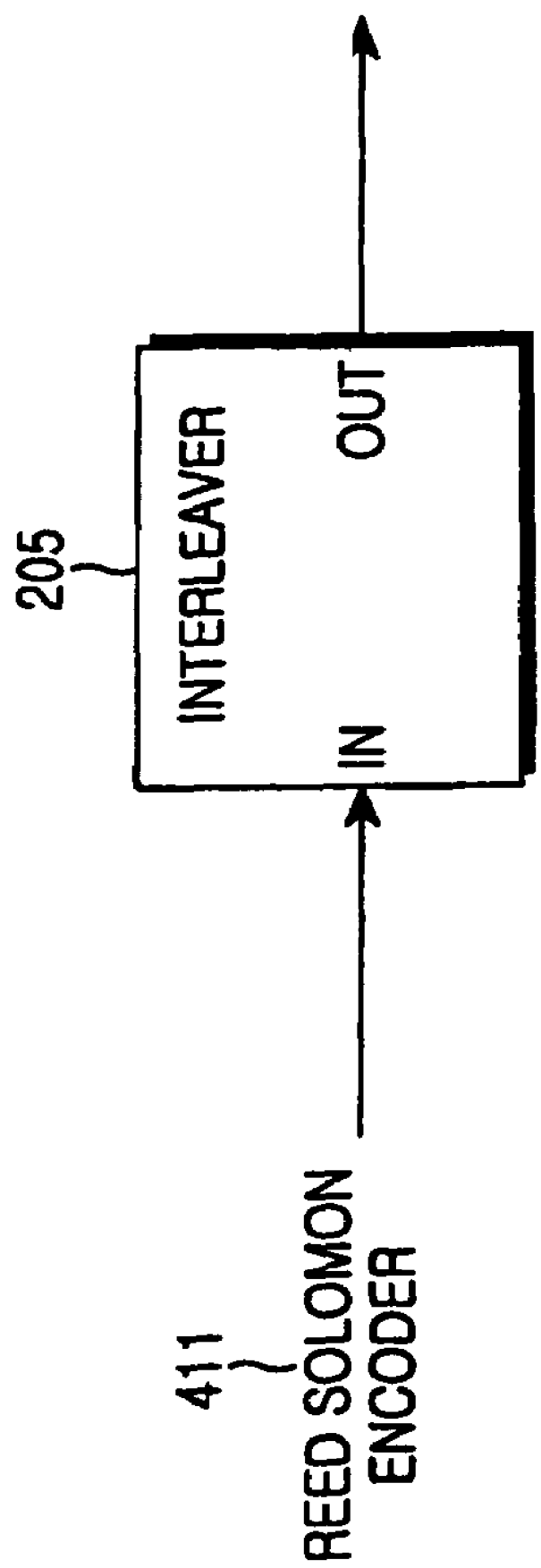
FIG. 4 illustrates an interleaver structure for interleaving Reed-Solomon coded OFDM symbols according to an embodiment of the present invention.

FIG. 4 illustrates an interleaver structure for interleaving Reed-Solomon coded OFDM symbols according to an embodiment of the present invention. The interleaver 205 receives an output signal 411 of the Reed-Solomon encoder 204, and interleaves the received signal 411 with an OFDM signal. The received signal 411 is interleaved such that it is mapped to the OFDM sub-channels. By the interleaving operation of the interleaver 205, the output signal 411 of the Reed-Solomon encoder 204 is converted into OFDM symbol data and then arranged. Several modulation methods for modulating the interleaved signal will be described with reference to FIGS. 5 to 8.

Figure 5:
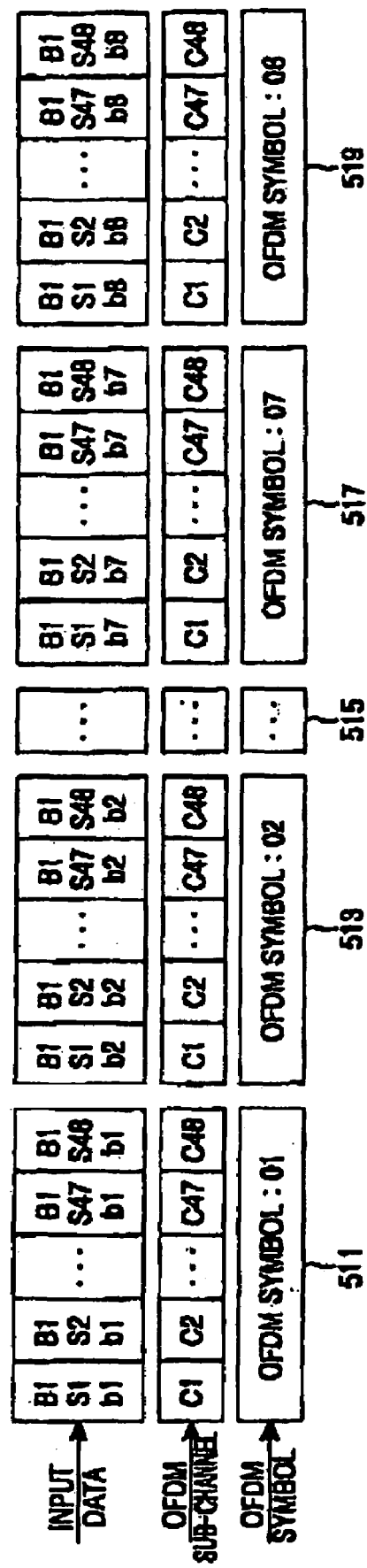
FIG. 5 illustrates an OFDM symbol structure and sub-channel arrangement based on BPSK modulation according to an embodiment of the present invention.
Figure 6:
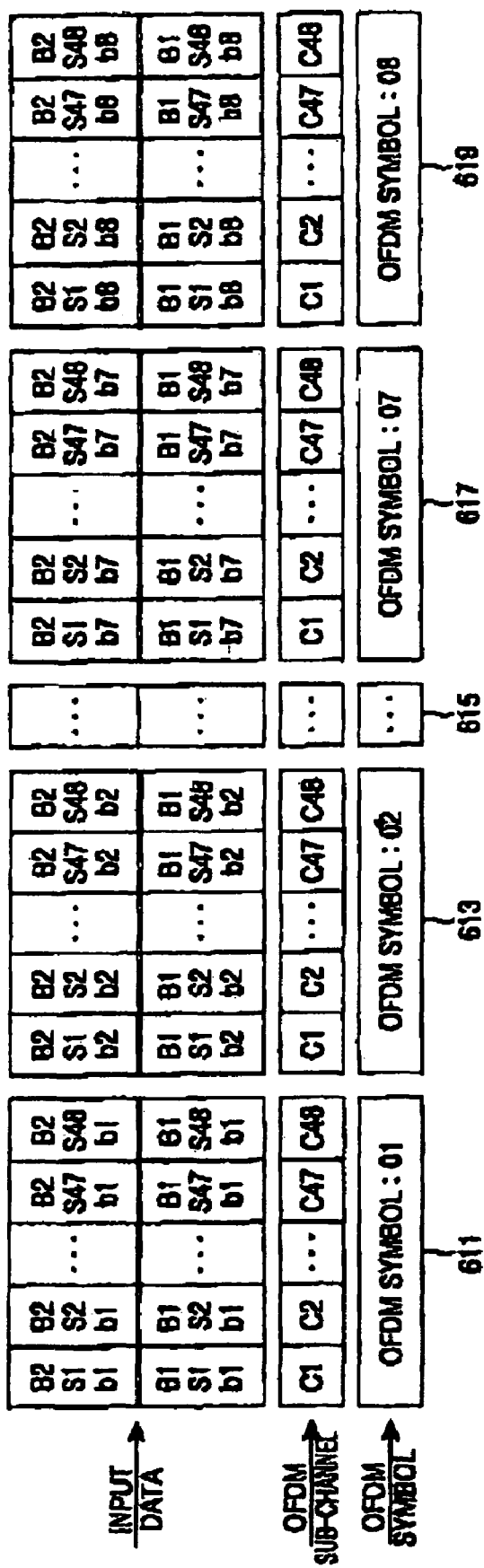
FIG. 6 illustrates an OFDM symbol structure and sub-channel arrangement based on QPSK modulation according to an embodiment of the present invention.
Figure 7:
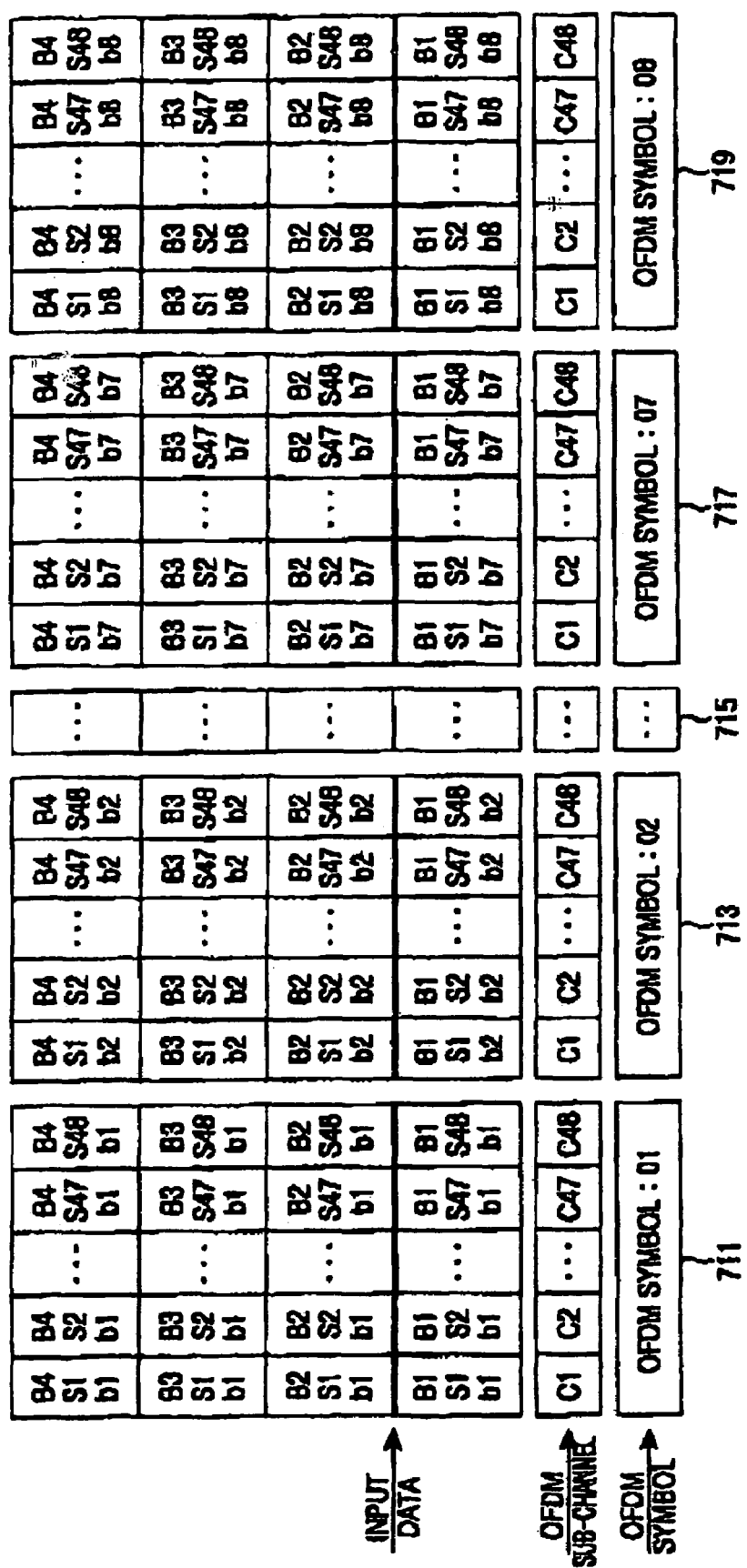
FIG. 7 illustrates an OFDM symbol structure and sub-channel arrangement based on 16QAM modulation according to an embodiment of the present invention.
Figure 8:
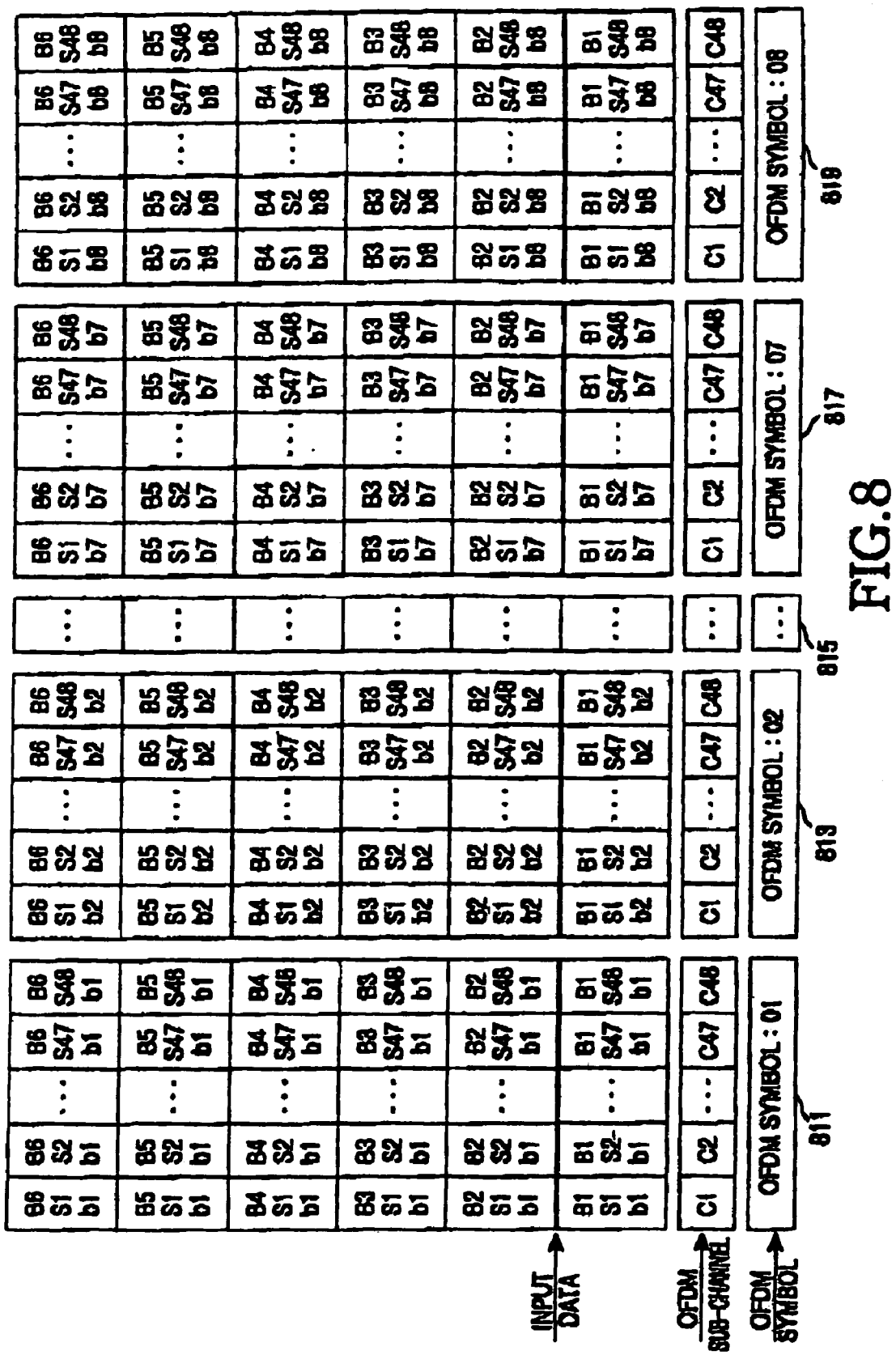
FIG. 8 illustrates an OFDM symbol structure and sub-channel arrangement based on 64QAM modulation according to an embodiment of the present invention.

FIG. 5 illustrates an OFDM symbol structure and sub-channel arrangement based on BPSK modulation according to an embodiment of the present invention, FIG. 6 illustrates an OFDM symbol structure and sub-channel arrangement based on QPSK modulation according to an embodiment of the present invention, FIG. 7 illustrates an OFDM symbol structure and sub-channel arrangement based on 16QAM modulation according to an embodiment of the present invention, and FIG. 8 illustrates an OFDM symbol structure and sub-channel arrangement based on 64QAM modulation according to an embodiment of the present invention.

Referring first to FIG. 5, each of OFDM symbols [01, 02, . . . , 08] 511-519 is comprised of 48 sub-channels [C1, C2, . . . , C48], and since the BPSK modulation is used, each sub-channel receives 1-bit data. As described in FIG. 3, one Reed-Solomon block, e.g., the Reed-Solomon block [B1] 311 is comprised of 48×8 bits, and the 48×8 bits are arranged in the OFDM symbols [01, 02, . . . , 08] 511-519 as shown in FIG. 5 by the interleaver 205. The 8 OFDM symbols 511-519 are also comprised of 8×48 bits, which are equal to the bit number of one Reed-Solomon block 311. Now, a description will be made as to how the interleaver 205 arranges the Reed-Solomon block [B1] 311 in the 8 OFDM symbols 511-519.

The interleaver 205 arranges 8 Reed-Solomon elements [b1, b2, . . . , b8] of a first Reed-Solomon symbol S1 of the Reed-Solomon block [B1] 311 in first sub-channels [01-C1, 02-C1, 03-C1, . . . , 08-C1] of the 8 OFDM symbols [01, 02, . . . , 08] 511-519. That is, the interleaver 205 arranges B1-S1-b1 in 01-C1, arranges B1-S1-b2 in 02-C1, and arranges B1-S1-b8 in 08-C1. That is, the interleaver 205 performs interleaving such that the 8 Reed-Solomon elements of the first Reed-Solomon symbol S1 are arranged in first sub-channels of the 8 OFDM symbols. Upon receiving such interleaved signal transmitted by the transmitter, the receiver performs inverse interleaving, i.e., deinterleaving. The deinterleaving refers to arranging the same sub-channel data blocks of the 8 OFDM symbols in one Reed-Solomon symbol. Therefore, if there exists frequency selective fading or narrow-band jamming signal on the transmission channel, transmission errors occur in a specific sub-channel of the OFDM symbol. The transmission errors occurred in the specific sub-channel are arranged in one Reed-Solomon symbol by deinterleaving, thus contributing to an improvement in error correction capability of the Reed-Solomon coding. Compared to the case where errors are dispersively arranged in a plurality of Reed-Solomon symbols, arranging the errors in one Reed-Solomon symbol extends error correction capability from 4×1 bits up to 4×8 bits, thus improving the system performance.

The interleaving based on the BPSK modulation according to the present invention has been described with reference to FIG. 5. Next, interleaving based on the QPSK modulation will be described with reference to FIG. 6.

FIG. 6 illustrates an OFDM symbol structure and sub-channel arrangement based on QPSK modulation according to an embodiment of the present invention.

Referring to FIG. 6, each of OFDM symbols [01, 02, . . . , 08] 611-619 is comprised of 48 sub-channels [C1, C2, . . . , C48], and since the QPSK modulation is used, each sub-channel receives 2-bit data. As described in FIG. 3, two Reed-Solomon blocks, e.g., the Reed-Solomon blocks [B1] 311 and [B2] 313 are comprised of 48×8×2 bits. The interleaver 205 arranges the 2 Reed-Solomon blocks [B1] 311 and [B2] 313 in the 8 OFDM symbols [01, 02, . . . , 08] 611-619 by interleaving. The 8 OFDM symbols 611-619 are also comprised of 2×8×48 bits, which are equal to the bit number of two Reed-Solomon blocks [B1] 311 and [B2] 313. Now, a description will be made as to how the interleaver 205 arranges the Reed-Solomon blocks [B1] 311 and [B2] 313 in the 8 OFDM symbols 611-619.

The interleaver 205 arranges 8 Reed-Solomon elements [b1, b2, . . . , b8] of a first Reed-Solomon symbol S1 of the first Reed-Solomon block [B1] 311 and 8 Reed-Solomon elements [b1, b2, . . . , b8] of a first Reed-Solomon symbol S1 of the second Reed-Solomon block [B2] 313 in first sub-channels [01-C1, 02-C1, 03-C1, . . . , 08-C1] of the 8 OFDM symbols [01, 02, . . . , 08] 611-619. That is, the interleaver 205 arranges B1-S1-b1 and B2-S1-b1 in 01-C1, arranges B1-S1-b2 and B2-S1-b2 in 02-C1, and arranges B1-S1-b8 and B2-S1-b8 in 08-C1. That is, the interleaver 205 performs interleaving such that the 2×8 Reed-Solomon elements of the first Reed-Solomon symbols S1 in the first Reed-Solomon block [B1] 311 and the second Reed-Solomon block [B2] 313 are arranged in first sub-channels of the 8 OFDM symbols. Upon receiving such interleaved signal transmitted by the transmitter, the receiver performs inverse interleaving, i.e., deinterleaving. The deinterleaving means arranging the same sub-channel data blocks of the 8 OFDM symbols in one Reed-Solomon symbol. Therefore, if there exists frequency selective fading or narrow-band jamming signal on the transmission channel, transmission errors occur in a specific sub-channel of the OFDM symbol. The transmission errors occurred in the specific sub-channel are arranged only in a specified one Reed-Solomon symbol by deinterleaving, contributing to an improvement in error correction capability of the Reed-Solomon coding, thereby improving the system performance.

The interleaving based on the QPSK modulation according to the present invention has been described with reference to FIG. 6. Next, interleaving based on the 16QAM modulation will be described with reference to FIG. 7.

FIG. 7 illustrates an OFDM symbol structure and sub-channel arrangement based on 16QAM modulation according to an embodiment of the present invention.

Referring to FIG. 7, each of OFDM symbols [01, 02, ..., 08] 711-719 is comprised of 48 sub-channels [C1, C2, ..., C48], and since the 16QAM modulation is used, each sub-channel receives 4-bit data. As described in FIG. 3, four Reed-Solomon blocks, e.g., the Reed-Solomon blocks [B1, B2, B3, B4] 311-317 are comprised of 48×8×4 bits. The interleaver 205 arranges the 4 Reed-Solomon blocks [B1, B2, B3, B4] 311-317 in the 8 OFDM symbols [01, 02, ..., 08] 711-719 by interleaving. The 8 OFDM symbols 711-719 are also comprised of 4×8×48 bits, which are equal to the bit number of 4 Reed-Solomon blocks [B1, B2, B3, B4] 311-317. Now, a description will be made as to how the interleaver 205 arranges the Reed-Solomon blocks [B1, B2, B3, B4] 311-317 in the 8 OFDM symbols 711-719.

The interleaver 205 arranges 8 Reed-Solomon elements [b1, b2, ..., b8] of a first Reed-Solomon symbol S1 of the first Reed-Solomon block [B1] 311, 8 Reed-Solomon elements [b1, b2, ..., b8] of a first Reed-Solomon symbol S1 of the second Reed-Solomon block [B2] 313, 8 Reed-Solomon elements [b1, b2, ..., b8] of a first Reed-Solomon symbol S1 of the third Reed-Solomon block [B3] 315, and 8 Reed-Solomon elements [b1, b2, ..., b8] of a first Reed-Solomon symbol S1 of the fourth Reed-Solomon block [B4] 317 in first sub-channels [01-C1, 02-C1, 03-C1, ..., 08-C1] of the 8 OFDM symbols [01, 02, ..., 08] 711-719. That is, the interleaver 205 arranges B1-S1-b1, B2-S1-b1, B3-S1-b1 and B4-S1-b1 in 01-C1, arranges B1-S1-b2, B2-S1-b2, B3-S1-b2 and B4-S1-b2 in 02-C1, and arranges B1-S1-b8, B2-S1-b8, B3-S1-b8 and B4-S1-b8 in 08-C1. That is, the interleaver 205 performs interleaving such that the 4×8 Reed-Solomon elements of the first Reed-Solomon symbols S1 in the first Reed-Solomon block [B1] 311, the second Reed-Solomon block [B2] 313, the third Reed-Solomon block [B3] 315 and the fourth Reed-Solomon block [B4] 317 are arranged in first sub-channels of the 8 OFDM symbols. Upon receiving such interleaved signal transmitted by the transmitter, the receiver performs inverse interleaving, i.e., deinterleaving. The deinterleaving means arranging the same sub-channel data blocks of the 8 OFDM symbols in one Reed-Solomon symbol. Therefore, if there exists frequency selective fading or narrow-band jamming signal on the transmission channel, transmission errors occur in a specific sub-channel of the OFDM symbol. The transmission errors occurred in the specific sub-channel are arranged only in a specified one Reed-Solomon symbol by deinterleaving, contributing to an improvement in error correction capability of the Reed-Solomon coding, thereby improving the system performance.

The interleaving based on the 16QAM modulation according to the present invention has been described with reference to FIG. 7. Next, interleaving based on the 64QAM modulation will be described with reference to FIG. 8.

FIG. 8 illustrates an OFDM symbol structure and sub-channel arrangement based on 16QAM modulation according to an embodiment of the present invention.

Referring to FIG. 8, each of OFDM symbols [01, 02, ..., 08] 811-819 is comprised of 48 sub-channels [C1, C2, ..., C48], and since the 64QAM modulation is used, each sub-channel receives 6-bit data. As described in FIG. 3, six Reed-Solomon blocks, e.g., the Reed-Solomon blocks [B1, B2, B3, B4, B5, B6] 311-321 are comprised of 48×8×6 bit. The interleaver 205 arranges the 6 Reed-Solomon blocks [B1, B2, B3, B4, B5, B6] 311-321 in the 8 OFDM symbols [01, 02, ..., 08] 811-819 by interleaving. The 8 OFDM symbols 811-819 are also comprised of 6×8×48 bits, which are equal to the bit number of 6 Reed-Solomon blocks [B1, B2, B3, B4, B5, B6] 311-321. Now, a description will be made as to how the interleaver 205 arranges the Reed-Solomon blocks [B1, B2, B3, B4, B5, B6] 311-321 in the 8 OFDM symbols 811-819.

The interleaver 205 arranges 8 Reed-Solomon elements [b1, b2, ..., b8] of a first Reed-Solomon symbol S1 of the first Reed-Solomon block [B1] 311, 8 Reed-Solomon elements [b1, b2, ..., b8] of a first Reed-Solomon symbol S1 of the second Reed-Solomon block [B2] 313, 8 Reed-Solomon elements [b1, b2, ..., b8] of a first Reed-Solomon symbol S1 of the third Reed-Solomon block [B3] 315, 8 Reed-Solomon elements [b1, b2, ..., b8] of a first Reed-Solomon symbol S1 of the fourth Reed-Solomon block [B4] 317, 8 Reed-Solomon elements [b1, b2, ..., b8] of a first Reed-Solomon symbol S1 of the fifth Reed-Solomon block [B5] 319 and 8 Reed-Solomon elements [b1, b2, ..., b8] of a first Reed-Solomon symbol S1 of the sixth Reed-Solomon block [B6] 321 in first sub-channels [01-C1, 02-C1, 03-C1, ..., 08-C1] of the 8 OFDM symbols [01, 02, ..., 08] 811-819. That is, the interleaver 205 arranges B1-S1-b1, B2-S1-b1, B3-S1-b1, B4-S1-b1, B5-S1-b1 and B6-S1-b1 in 01-C1, arranges B1-S1-b2, B2-S1-b2, B3-S1-b2, B4-S1-b2, B5-S1-b2 and B6-S1-b2 in 02-C1, and arranges B1-S1-b8, B2-S1-b8, B3-S1-b8, B4-S1-b8, B5-S1-b8 and B6-S1-b8 in 08-C1. That is, the interleaver 205 performs interleaving such that the 6×8 Reed-Solomon elements of the first Reed-Solomon symbols S1 in the first Reed-Solomon block [B1] 311, the second Reed-Solomon block [B2] 313, the third Reed-Solomon block [B3] 315, the fourth Reed-Solomon block [B4] 317, the fifth Reed-Solomon block [B5] 319 and the sixth Reed-Solomon block [B4] 321 are arranged in first sub-channels of the 8 OFDM symbols. Upon receiving such interleaved signal transmitted by the transmitter, the receiver performs inverse interleaving, i.e., deinterleaving. The deinterleaving means arranging the same sub-channel data blocks of the 8 OFDM symbols in one Reed-Solomon symbol. Therefore, if there exists frequency selective fading or narrow-band jamming signal on the transmission channel, transmission errors occur in a specific sub-channel of the OFDM symbol. The transmission errors occurred in the specific sub-channel are arranged only in a specified one Reed-Solomon symbol by deinterleaving, contributing to an improvement in error correction capability of the Reed-Solomon coding, thereby improving the system performance.

As described above, the transmitter interleaves Reed-Solomon coded data symbols according to the present invention through respective sub-channels of the OFDM symbols before transmission, so that when the receiver receives the interleaved OFDM symbols, the errors occurred in the transmission channel exist in only a specified one Reed-Solomon symbol after deinterleaving, thus contributing to an improvement in error correction capability of the Reed-Solomon coding.

Next, a sub-channel repetitive transmission scheme according to the present invention will be described with reference to FIGS. 9 to 11.

The sub-channel repetitive transmission is used in the OFDM system to repeatedly transmit one transmission data block over different OFDM sub-channels. When the sub-channel repetitive transmission is used, the transmission data is resistant to errors occurring in the transmission channel. In addition, since the frequency diversity is acquired by the repetitive transmission, it is possible to provide reliable communication even in a frequency selective fading environment or a poor environment where an intended/non-intended interference signals exist. Further, it is possible to vary the associated sub-channels during the sub-channel repetitive transmission depending on the time. That is, it is possible to acquire additional frequency diversity by varying a frequency of the input data depending on the time. The sub-channel repetitive transmission scheme will be described with reference to FIGS. 9 to 11.

Figure 9:
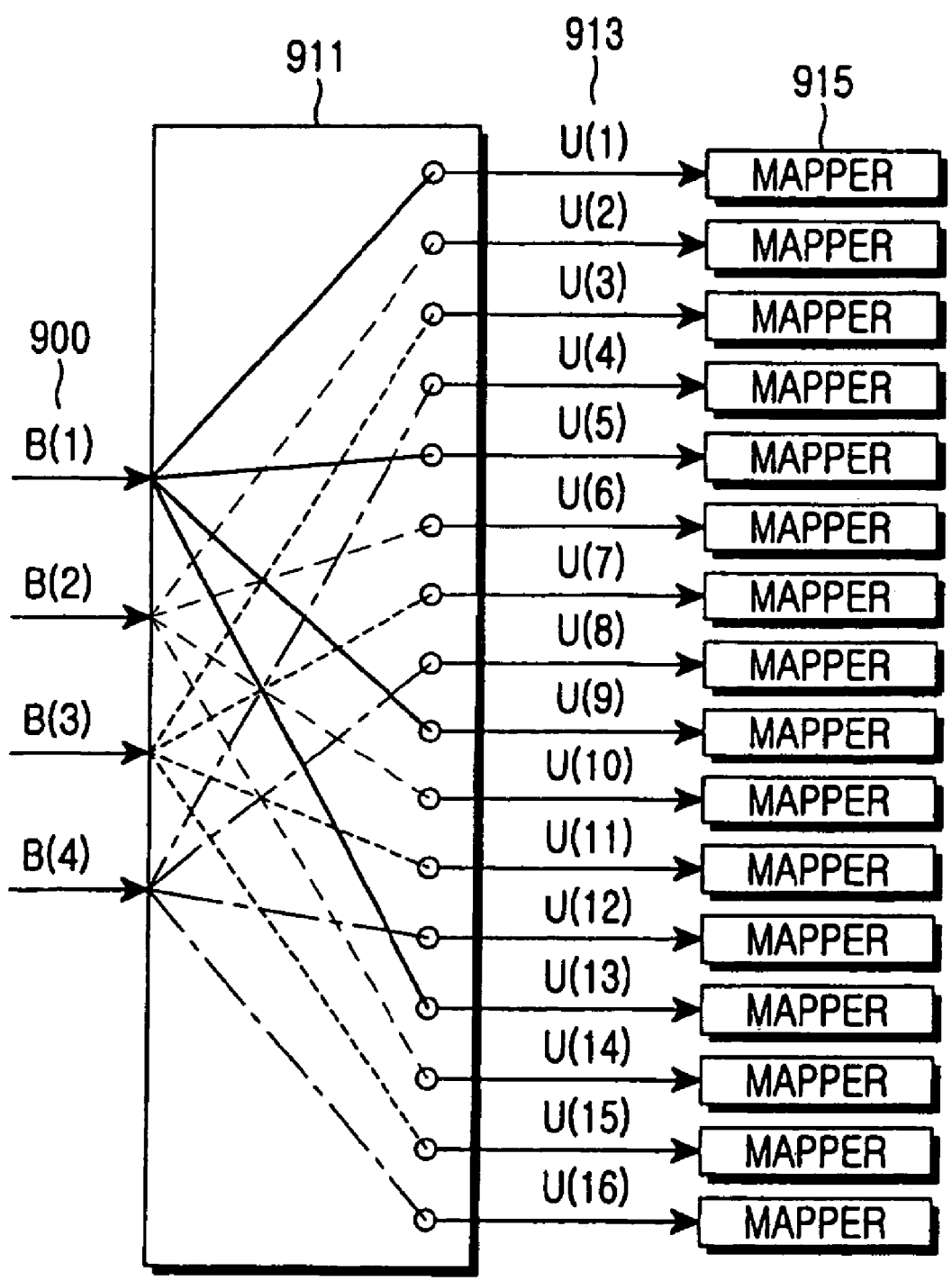
FIG. 9 illustrates a structure of a sub-channel repeater according to a first embodiment of the present invention.

FIG. 9 illustrates a structure of a sub-channel repeater according to a first embodiment of the present invention. Referring to FIG. 9, input data blocks [B(1), B(2), B(3), B(4)] 900 are provided to a sub-channel repeater 911. The sub-channel repeater 911 repeats each of the input data blocks [B(1), B(2), B(3), B(4)] 900 over 4 sub-channels. Further, reference numerals 913 of U(1) to U(16) represent sub-channels. Thus, as illustrated in FIG. 9, the input data block B1 is repeated over the sub-channels U(1), U(5), U(9) and U(13), and the input data block B(2) is repeated over the sub-channels U(2), U(6), U(10) and U(14). Further, the input data block B(3) is repeated over the sub-channels U(3), U(7), U(11) and U(15), and the input data block B(4) is repeated over the sub-channels U(4), U(8), U(12) and U(16). As a result, the received input data blocks 900 are subject to sub-channel repetition by the sub-channel repeater 911, and thus converted to 16 sub-channel data blocks [U(1), U(2), . . . , U(16)] 913. Then, the sub-channel data blocks [U(1), U(2), . . . , U(16)] 913 are provided to associated mappers 915 where the provided sub-channel data blocks are subject to mapping for modulation.

FIG. 9 shows an example where 4 input data blocks are repeated over 4 sub-channels, and the repeated sub-channel data blocks are mapped in their own unique mappers. However, FIG. 10 shows an example where the sub-channel data blocks are mapped by grouping.

Figure 10:
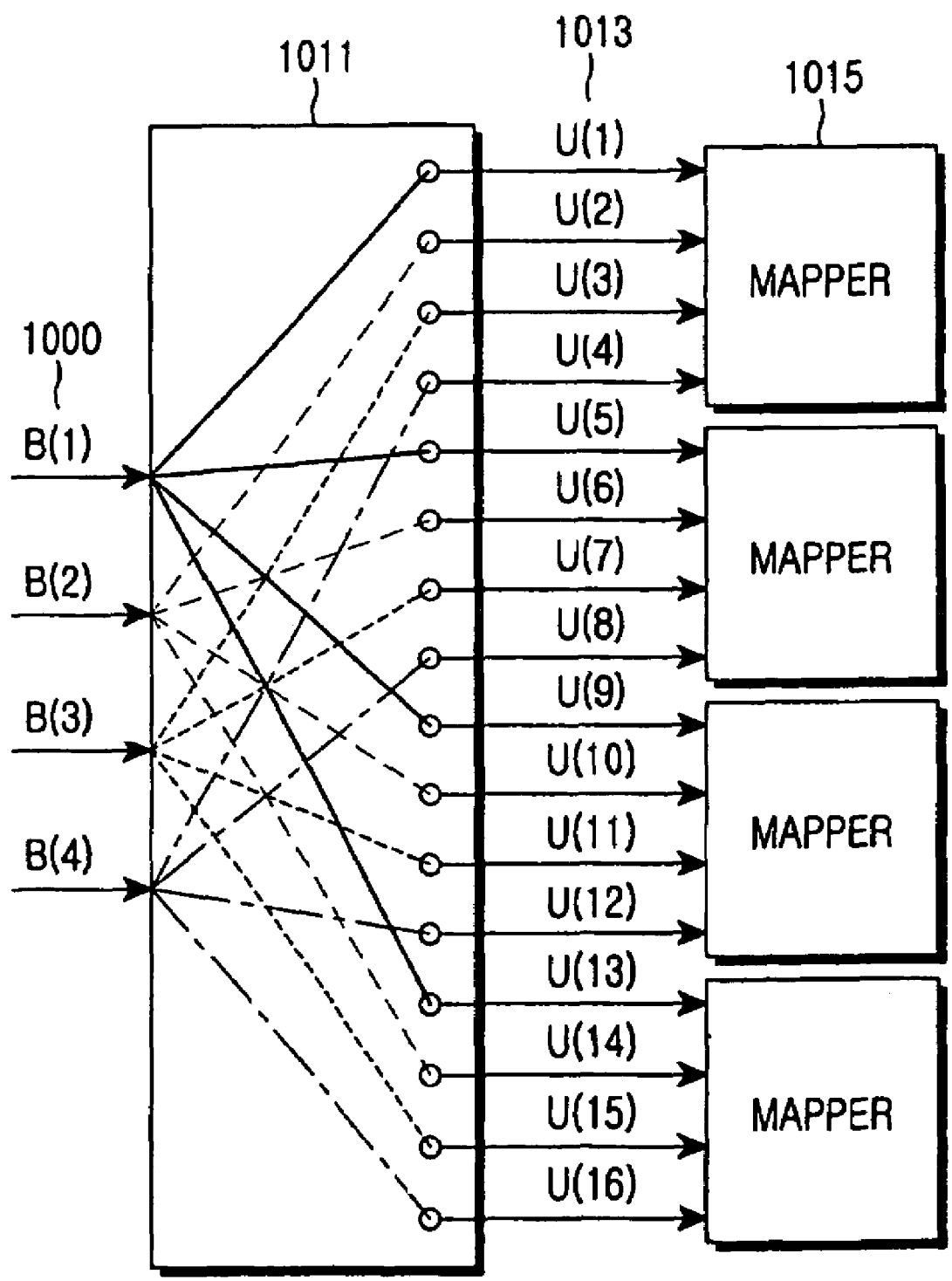
FIG. 10 illustrates a structure of a sub-channel repeater according to a second embodiment of the present invention.

FIG. 10 illustrates a structure of a sub-channel repeater according to a second embodiment of the present invention. Referring to FIG. 10, input data blocks 1000, a sub-channel repeater 1011 and sub-channel data blocks 1013 are identical in function to the input data blocks 900, the sub-channel repeater 911, and the sub-channel data blocks 913 of FIG. 9. In FIG. 9, the sub-channel data blocks 913 are mapped by their associated mappers 915. In FIG. 10, however, the sub-channel data blocks 1013 are mapped by the mappers 1015 by grouping. Here, each of the mappers 1015 maps 4 sub-channels as one modulation symbol. Since the 4 sub-channels having different repeated data blocks are mapped as one modulation symbol, the number of the input data blocks to the sub-channel repeater 1011 and the number of the sub-channels after sub-channel repetition are both equal to 4. Although the 4 sub-channel data blocks are mapped as one modulation symbol in FIG. 10, it is also possible to map 2 sub-channel data blocks as one modulation symbol, thereby mapping 8 sub-channels.

The sub-channel repetitive transmission scheme has been described with reference to FIGS. 9 and 10. Next, an internal structure of the sub-channel repeater for performing the sub-channel repetitive transmission will be described with reference to FIG. 11.

Figure 11:
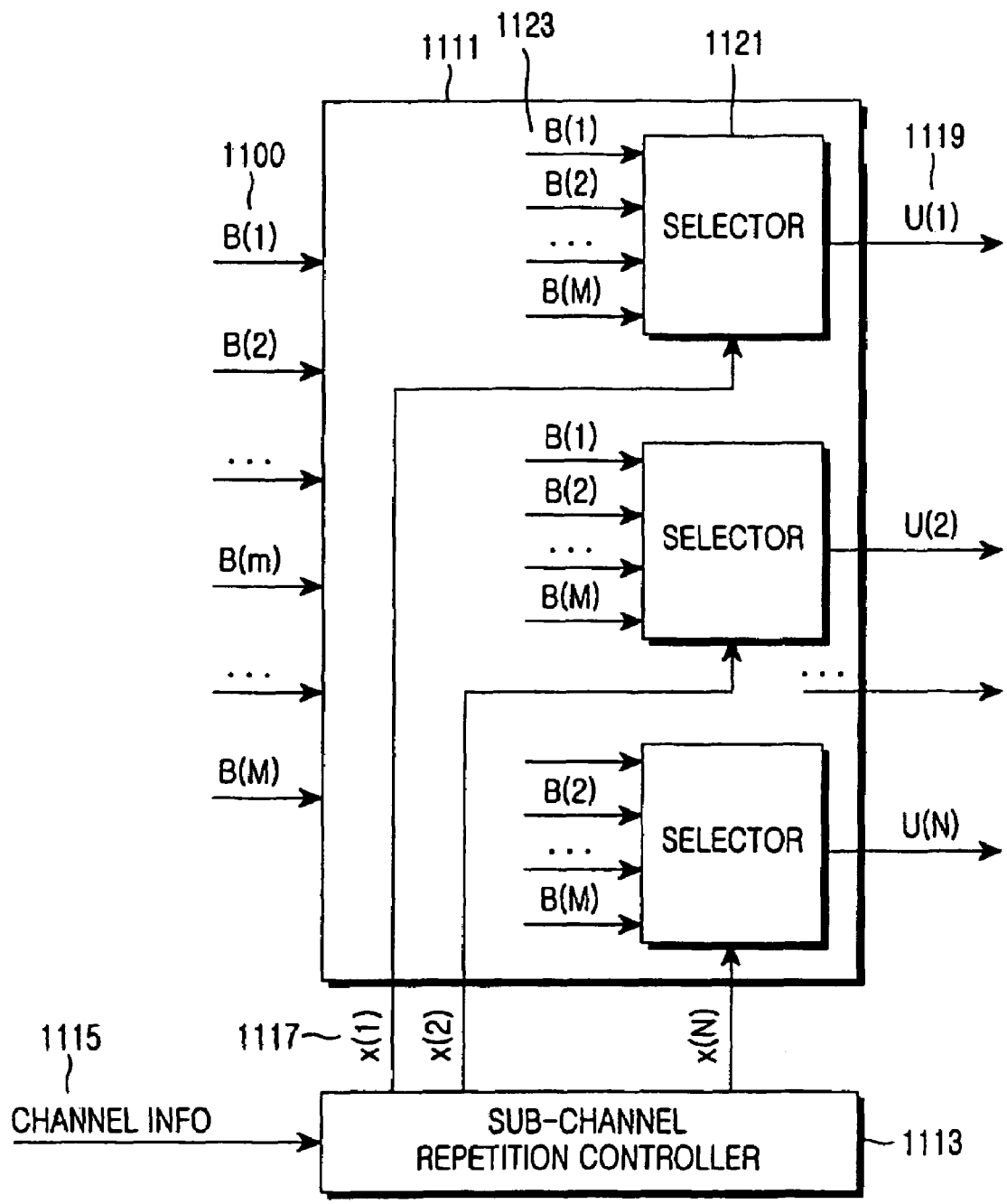
FIG. 11 illustrates an internal structure of the sub-channel repeater shown in FIGS. 9 and 10.

FIG. 11 illustrates an internal structure of the sub-channel repeater shown in FIGS. 9 and 10. Referring to FIG. 11, M input data blocks [B(1), B(2), . . . , B(M)] 1100 are provided to a sub-channel repeater 1111. The sub-channel repeater 1111 then repeats the input data blocks 1100 under the control of a sub-channel repetition controller 1113. The sub-channel repetition controller 1113 controls the sub-channel repetition using channel information 1115, and outputs N sub-channel repetition control signals x(1), x(2), x(3), . . . , x(N). The sub-channel repeater 1111 performs sub-channel repetition on the input data blocks 1100 according to the sub-channel repetition control signals output from the sub-channel repetition controller 1113, and outputs sub-channel data blocks [U(1), U(2), . . . , U(N)] 1119. In order to specifically describe the sub-channel repetition, a process for converting and outputting the first sub-channel data block U(1) output from the sub-channel repeater 1111 will be described by way of example. The sub-channel repeater 1111 includes N selectors. For example, a first selector 1121 receives the input data blocks 1100 as input data blocks 1123, selects one of the M input data blocks 1123, and converts the selected data block to the sub-channel data block U(1). The selector 1121 converts one of the input data blocks 1123 to the sub-channel data block U(1) according to a first sub-channel repetition control signal x(1) output from the sub-channel repetition controller 113.

In FIGS. 9 to 11, since the sub-channel repetition transmission scheme according to the second embodiment of the present invention repeatedly transmits one input data block over a plurality of different sub-channels, it is resistant to errors occurring in the transmission channel. In addition, since the frequency diversity is acquired by the repetitive transmission, it is possible to provide reliable communication even in a frequency selective fading environment or a poor environment where an intended/non-intended interference signals exist. Further, it is possible to vary the associated sub-channels during the sub-channel repetitive transmission depending on the time. In this case, it is possible to acquire additional frequency diversity.

Next, a scheme for dynamically adaptively assigning sub-channels according to the third embodiment of the present invention will be described with reference to FIGS. 12A to 13.

Figure 12A:
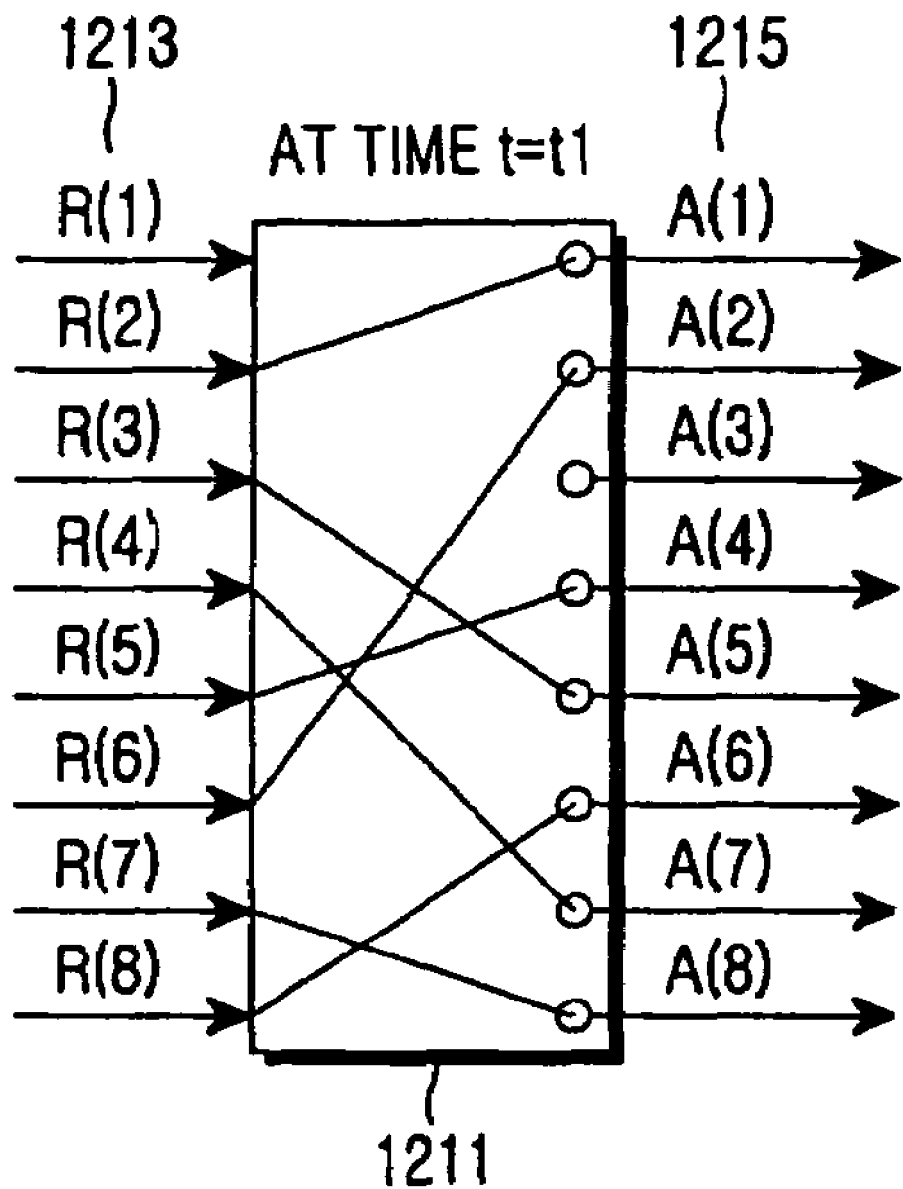
FIGS. 12A and 12B illustrate a sub-channel assignor according to an embodiment of the present invention.
Figure 12B:
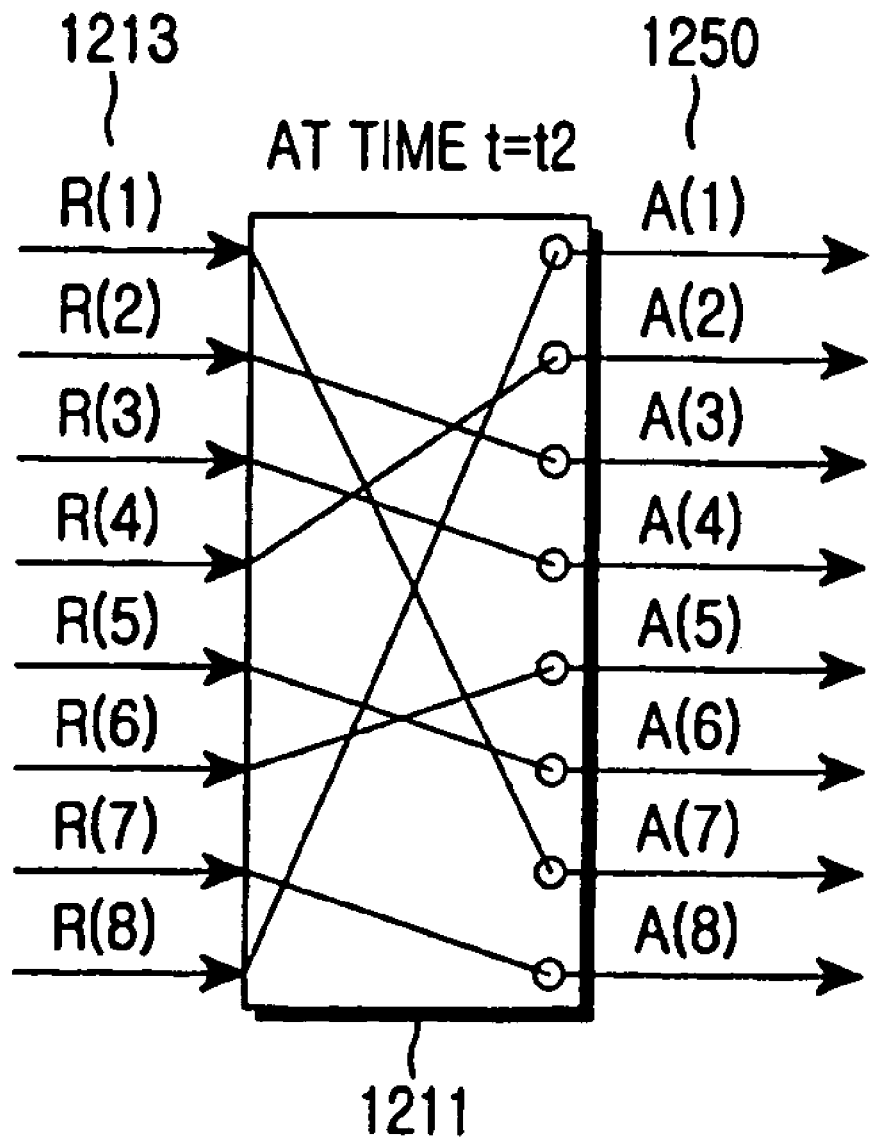

FIGS. 12A and 12B illustrate a sub-channel assignment scheme for frequency transition, especially a scheme for dynamically adaptively performing sub-channel assignment according to an embodiment of the present invention.

Referring to FIG. 12A, sub-channel data blocks [R(1), R(2), . . . , R(8)] 1213 applied to a sub-channel assignor 1211 at time t=t1 constitute 8 sub-channels. The received sub-channel data blocks 1213 are dynamically assigned to the associated sub-channels by the sub-channel assignor 1211, and are output as 8 output sub-channels [A(1), A(2), . . . , A(8)] 1215. For example, at the time t=t1, a first input sub-channel data block R(1) is assigned to a third output sub-channel A(3) among the output sub-channels 1215 by the sub-channel assignor 1211. However, as illustrated in FIG. 12B, at time t=t2 after a lapse of time t=t+1, the sub-channel assignor 1211 assigns the input sub-channel data blocks 1213 to the 8 sub-channels [A(1), A(2), . . . , A(8)] 1250 in a different manner from the dynamical assignment of FIG. 12A, i.e., assigns the input sub-channel data blocks 1213 such that frequency transition occurs. That is, the sub-channel assignments are performed differently at time t=t2 and time t=t1. Varying the sub-channel assignment means that transition occurs in terms of a frequency of the sub-channels. Therefore, there occur the effects of the frequency transition of the sub-channels.

Next, an internal structure of a sub-channel assignor for controlling the dynamic/adaptive sub-channel assignment described in conjunction with FIGS. 12A and 12B will be described with reference to FIG. 13.

Figure 13:
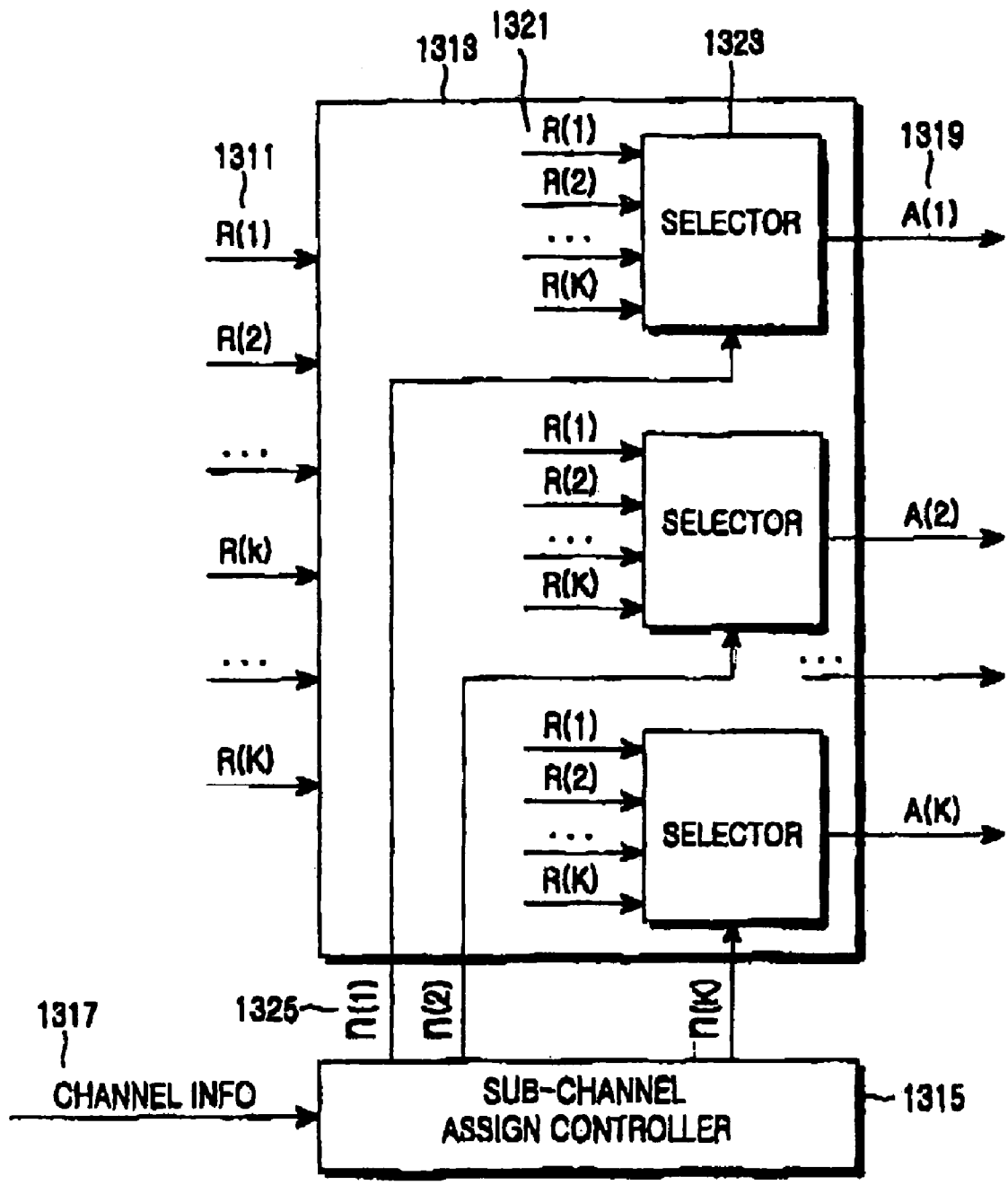
FIG. 13 illustrates an internal structure of a sub-channel assignor according to an embodiment of the present invention.

FIG. 13 illustrates an internal structure of a sub-channel assignor according to an embodiment of the present invention. Referring to FIG. 13, K input sub-channel data blocks [R(1), R(2), . . . , R(K)] 1311 are provided to a sub-channel assignor 1313. The sub-channel assignor 1313 then performs dynamic sub-channel assignment on the input sub-channel data blocks 1311. The dynamic sub-channel assignment by the sub-channel assignor 1313 is performed under the control of a sub-channel assignment controller 1315. The sub-channel assignment controller 1315 controls the dynamic sub-channel assignment according to channel information 1317. The sub-channel assignment controller 1315 provides K sub-channel assignment control signals n(1), n(2), n(3), . . . , n(K) to the sub-channel assignor 1313. The sub-channel assignor 1313 then assigns the input sub-channel data blocks [R(1), R(2), . . . , R(K)] 1311 to the associated output sub-channels [A(1), A(2), . . . , A(K)] 1319 according to the sub-channel assignment control signals n(1), n(2), n(3), . . . , n(K). In order to specifically describe the sub-channel assignment, a process for assigning the input sub-channel data blocks 1311 to a first output sub-channel A(1) among the output sub-channels [A(1), A(2), . . . , A(K)] 1319 will be described by way of example. The input sub-channel data blocks 1311 are converted to input data blocks 1321. Then, a selector 1323 selects one of the K input sub-channel data blocks 1321 under the control of the sub-channel assignment controller 1315, and assigns the selected input sub-channel data block to the output sub-channel A(1). Here, the selector 1323 assigns the input sub-channel data block to the corresponding output sub-channel depending on the first sub-channel assignment control signal n(1) generated by the sub-channel assignment controller 1315.

As described with reference to FIGS. 12A to 13, the OFDM system performs dynamic sub-channel assignment by varying the sub-channel assignment depending on the time or a specific code pattern, rather than statically assigning the sub-channels, and acquires frequency diversity by adaptively assigning the sub-channels according to the channel conditions, thus contributing to an improvement in system performance. Of course, it is possible to further improve performance in terms of frequency diversity by combining the sub-channel repetitive transmission scheme of the second embodiment with the sub-channel assignment scheme of the third embodiment.

Next, a transmission scheme for selecting a minimum PAPR sub-channel without separate supplemental information according to the fourth embodiment of the present invention will be described with reference to FIGS. 14 to 16.

Figure 14:
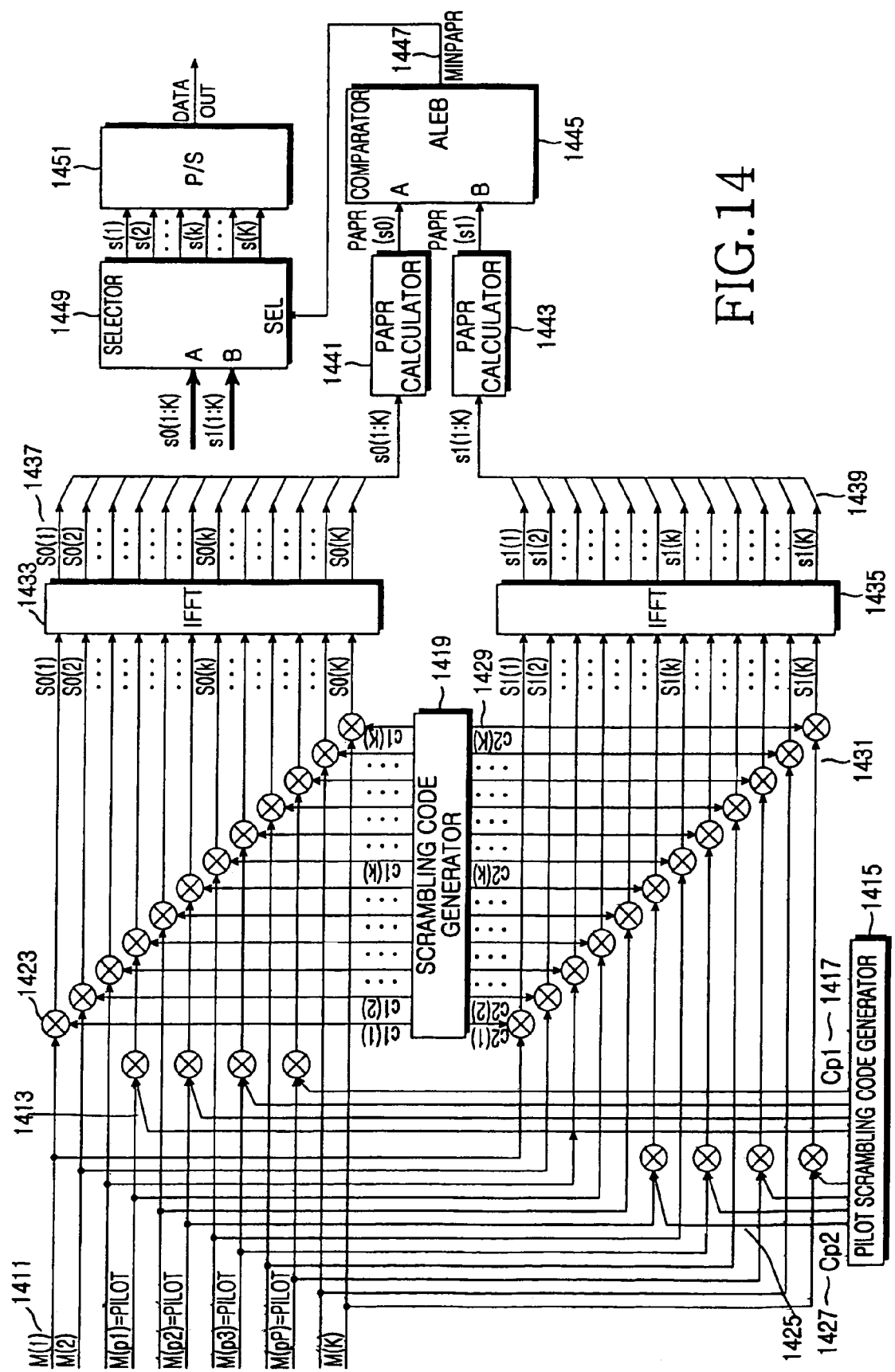
FIG. 14 illustrates a structure of a minimum PAPR select sub-channel transmitter according to an embodiment of the present invention.

FIG. 14 illustrates a structure of a minimum PAPR select sub-channel transmitter according to an embodiment of the present invention. It will be assumed that 4 pilot sub-channels [M(p1), M(p2), M(p3), M(p4)] are included in K input sub-channels [M(1), M(2), . . . , M(p1), . . . , M(p2), . . . , M(p3), . . . , M(p4), . . . , M(K)] 1411. Here, the pilot sub-channel transmission points are previously determined in the OFDM system.

In a first path, the pilot sub-channel data blocks [M(p1), M(p2), M(p3), M(p4)] among the K sub-channel data blocks 1411 are provided to associated multipliers 1413. The multipliers 1413 multiply the pilot sub-channel data blocks [M(p1), M(p2), M(p3), M(p4)] by first pilot scrambling codes [Cp1] 1417 generated by a pilot scrambling code generator 1415, for phase modulation. For example, the first pilot scrambling codes 1417 have a value of Cp1=[1, 1, 1, 1]. The K sub-channel data blocks 1411 including the phase-modulated pilot sub-channel data blocks [M(p1), M(p2), M(p3), M(p4)] are scrambled by scramblers 1423 with first scrambling codes [c1(1), c1(2), . . . , c1(K)] 1421 generated by a scrambling code generator 1419.

In a second path, the pilot sub-channel data blocks [M(p1), M(p2), M(p3), M(p4)] among the K sub-channel data blocks 1411 are provided to associated multipliers 1425. The multipliers 1425 multiply the pilot sub-channel data blocks [M(p1), M(p2), M(p3), M(p4)] by second pilot scrambling codes [Cp2] 1427 generated by the pilot scrambling code generator 1415, for phase modulation. For example, the second pilot scrambling codes 1427 have a value of Cp2=[−1, −1, −1, −1]. The K sub-channel data blocks 1411 including the phase-modulated pilot sub-channel data blocks [M(p1), M(p2), M(p3), M(p4)] are scrambled by scramblers 1431 with second scrambling codes [c2(1), c2(2), . . . , c2(K)] 1429 generated by the scrambling code generator 1419.

The sub-channel data blocks generated in the first and second paths, i.e., the sub-channel data blocks [S0(1), S0(2), . . . , S0(K)] output from the multipliers 1423 and the sub-channel data blocks [S1(1), S1(2), . . . , S1(K)] output from the multipliers 1431 are subject to inverse fast Fourier transform by an IFFT 1433 and an IFFT 1435, respectively. The IFFT-transformed sub-channel data blocks, i.e., the sub-data blocks [s0(1), s0(2), . . . , s0(K)] 1437 output from the IFFT 1433 and the sub-data blocks [s1(1), s1(2), . . . , s1(K)] 1439 output from the IFFT 1435 are provided to a PAPR calculator 1441 and a PAPR calculator 1443, respectively. The PAPR calculator 1441 calculates a peak-to-average power ratio PAPR(s0) of the sub-channel data blocks 1437 output from the IFFT 1433, and provides the PAPR(s0) to a comparator 1445. Further, the PAPR calculator 1443 calculates a peak-to-average power ratio PAPR(s1) of the sub-channel data blocks 1439 output from the IFFT 1435, and provides the PAPR(s1) to the comparator 1445. The comparator 1445 then compares the PAPR(s0) output from the PAPR calculator 1441 with the PAPR (s1) output from the PAPR calculator 1443, selects a MINIPAPR value 1447 having a lower PAPR, and provides the selected MINIPAPR value 1447 to a selector 1449. The selector 1449 then selects sub-channel data blocks having a lower PAPR among the sub-channel data blocks 1437 output from the IFFT 1443 and the sub-channel data blocks 1439 output from the IFFT 1435, based on the MINIPAPR value output from the comparator 1445, and provides the selected sub-channel data blocks [s(1), s(2), . . . , s(K)] to a P/S converter 1451. The P/S converter 1451 then converts the parallel input sub-channel data blocks into serial output sub-channel data blocks. Although the embodiment of the present invention has been described with reference to an example where the number of the pilot scrambling codes and the number of the scrambling codes are both 2, the number of the pilot scrambling codes and the number of the scrambling codes are extendable.

Figure 15:
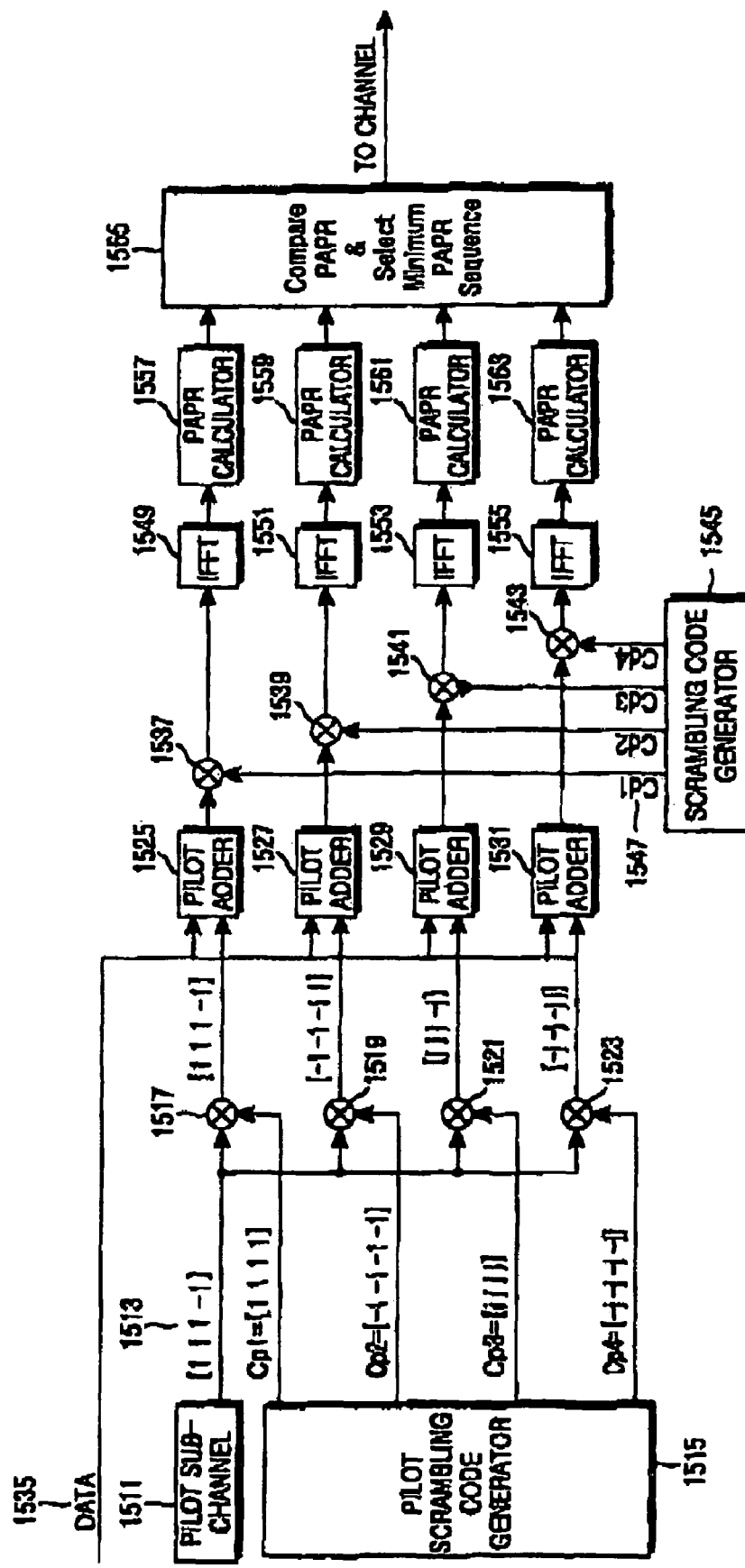
FIG. 15 illustrates a structure of an extended minimum PAPR select sub-channel transmitter in which the number of IFFTs is extended.
Figure 16:
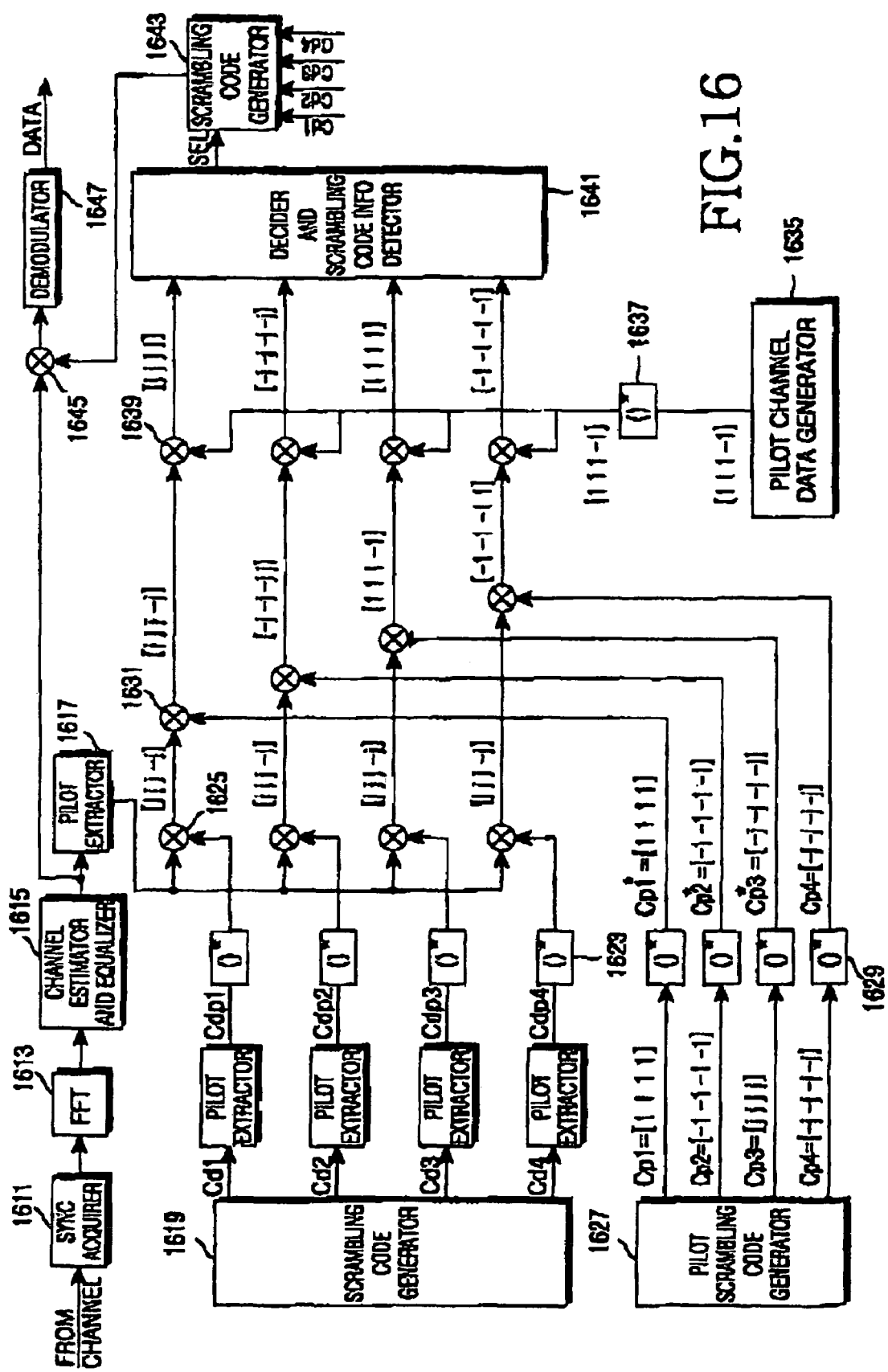
FIG. 16 illustrates a structure of a receiver corresponding to the minimum PAPR select sub-channel transmitter of FIG. 15.

With reference to FIGS. 15 and 16, the present invention will be described regarding an embodiment where the number of the pilot scrambling codes and the number of the scrambling codes are both 4.

FIG. 15 illustrates a structure of an extended minimum PAPR select sub-channel transmitter in which the number of IFFTs is extended. Referring to FIG. 15, 4 pilot scrambling codes generated to transmit 4 scrambling code information blocks over 4 pilot sub-channels include a first pilot scrambling code Cp1=[1, 1, 1, 1], a second pilot scrambling code Cp2=[−1, −1, −1, −1], a third pilot scrambling code Cp3=[j, j, j, j], and a fourth pilot scrambling code Cp4=[−j, −j, −j, −j]. The pilot scrambling codes and the scrambling codes are previously recognized by both the transmitter and the receiver.

A pilot sub-channel data generator 1511 generates transmission pilot sub-channel data 1513. It will be assumed herein that the transmission pilot sub-channel data 1513 has a value of [1, 1, 1, −1]. A pilot scrambling code generator 1515 generates the first pilot scrambling code Cp1=[1, 1, 1, 1], the second pilot scrambling code Cp2=[−1, −1, −1, −1], the third pilot scrambling code Cp3=[j, j, j, j], and the fourth pilot scrambling code Cp4=[−j, −j, −j, −j]. Multipliers 1517, 1519, 1521 and 1523 multiply the pilot sub-channel data 1513 generated by the pilot sub-channel data generator 1511 by the first pilot scrambling code Cp1=[1, 1, 1, 1], the second pilot scrambling code Cp2=[−1, −1, −1, −1], the third pilot scrambling code Cp3=[j, j, j, j,], and the fourth pilot scrambling code Cp4=[−j, −j, −j, −j], respectively. The multiplier 1517 outputs a signal of [1, 1, 1, −1], the multiplier 1519 outputs a signal of [−1, 31 1, −1, 1], the multiplier 1521 outputs a signal of [j, j, j, −j], and the multiplier 1523 outputs a signal of [−j, −j, −j, j]. The scrambled pilot sub-channel data blocks output from the multipliers 1517, 1519, 1521 and 1523 are added to data 1535 on the sub-channel transmitting actual data by pilot adders 1525, 1527, 1529 and 1531, respectively. The signals output from the pilot adders 1525, 1527, 1529 and 1531 are scrambled by scramblers 1537, 1539, 1541 and 1543 with scrambling codes 1547 generated by a scrambling code generator 1545. The scrambling codes 1547 generated by the scrambling code generator 1545 include a first scrambling code Cd1, a second scrambling code Cd2, a third scrambling code Cd3 and a fourth scrambling code Cd4. The signals output from the scramblers 1537, 1539, 1541 and 1543 are provided to IFFTs 1549, 1551, 1553 and 1555, respectively. The IFFTs 1549, 1551, 1553 and 1555 IFFT-transform the signals output from the scramblers 1537, 1539, 1541 and 1543, respectively, and provide their outputs to PAPR calculators 1557, 1559, 1561 and 1563. The PAPR calculators 1557, 1559, 1561 and 1563 then calculate PAPRs of the signals provided from the IFFTs 1549, 1551, 1553 and 1555, respectively, and provide their outputs to a PAPR comparator & minimum PAPR selector 1565. The PAPR comparator & minimum PAPR selector 1565 compares the PAPRs of the sub-channel data blocks calculated by the PAPR calculators 1557, 1559, 1561 and 1563, selects a sub-channel data block having a minimum PAPR, and transmits the selected sub-channel data over the sub-channel.

If it is assumed in FIG. 15 that the sub-channel data block scrambled by the third scrambling code Cd3 has the minimum PAPR, the pilot sub-channel data [1, 1, 1, −1] 1513 is scrambled with the third scrambling code Cp3=[j, j, j, j,], generating the scrambled pilot sub-channel data block [j, j, j, −j]. For the sake of convenience, if it is assumed that the scrambling code where the pilot channel exists is [1, 1, 1, 1] (of course, [j, 1, 1, j] is also available), the transmission pilot sub-channel data is transmitted in the form of [j, j, j, −j].

Next, a structure of a receiver corresponding to the minimum PAPR select sub-channel transmitter described in conjunction with FIG. 15 will be described with reference to FIG. 16.

FIG. 16 illustrates a structure of a receiver corresponding to the minimum PAPR select sub-channel transmitter of FIG. 15. Referring to FIG. 16, a signal received over a radio channel is provided to a frequency synchronization acquirer 1611. The frequency synchronization acquirer 1611 acquires synchronization between the transmitter and the receiver by performing rough frequency synchronization and fine frequency synchronization, and provides the frequency-synchronized channel data to a fast Fourier transformer (FFT) 1613. The FFT 1613 then FFT-transforms the channel data output from the frequency synchronization acquirer 1611, and provides its output to a channel estimator and equalizer 1615. The channel estimator and equalizer 1615 performs channel estimation and equalization on the signal provided from the FFT 1613. The data output from the channel estimator and equalizer 1615 is provided to a pilot extractor 1617. The pilot extractor 1617 extracts pilot sub-channel data from the output data of the channel estimator and equalizer 1615. Here, the position where the pilot sub-channel data of the received channel signal exists is previously agreed by the transmitter and the receiver.

A scrambling code generator 1619 generates the same scrambling codes as used by the transmitter, i.e., generates a first scrambling code Cd1, a second scrambling code Cd2, a third scrambling code Cd3 and a fourth scrambling code Cd4. The generated scrambling codes are provided to associated pilot extractors 1621. The pilot extractors 1621 extract pilot channel data blocks Cdp1, Cdp2, Cdp3 and Cdp4, respectively, and provide the extracted pilot channel data blocks to associated complex conjugate operators 1623. The complex conjugate operators 1623 complex-conjugate the extracted pilot channel data blocks Cdp1, Cdp2, Cdp3 and Cdp4, respectively. The signals output from the complex conjugate operators 1623 are multiplied by multipliers 1625 by the signal output from the pilot extractor 1617, generating pilot sub-channel data blocks [j, j, j, −j], [j, j, j, −j], [j, j, j, −j] and [j, j, j, −j,] in which the effects of the scrambling codes are removed.

A pilot scrambling code generator 1627 also generates the same pilot scrambling codes as used by the transmitter, i.e., generates a first pilot scrambling code Cp1=[1, 1, 1, 1,], a second pilot scrambling code Cp2=[−1, −1, −1, −1], a third pilot scrambling code Cp3=[j, j, j, j], and a fourth pilot scrambling code Cp4=[−j, −j, −j, −j]. The 4 pilot scrambling codes generated by the pilot scrambling code generator 1627 are provided to associated complex conjugate operators 1629. The complex conjugate operators 1629 complex-conjugate the pilot scrambling codes, and provides the complex-conjugated pilot scrambling codes Cp1*=[1, 1, 1, 1], Cp2*=[−1, −1, −1, −1], Cp3*=[−j, −j, −j, −j] and Cp4*= [j, j, j, j] to associated multipliers 1631. The multipliers 1631 multiply the signals output form the multipliers 1625 by the signals output from the complex conjugate operators 1629, and generate signals [j, j, j, −j], [−j, −j, −j, j], [1, 1, 1, −1] and [−1, −1, −1, 1] in which even the effects of the pilot scrambling codes are removed.

A pilot sub-channel data generator 1635 generates the same pilot sub-channel data as generated by the transmitter, i.e., generates pilot sub-channel data [1, 1, 1, −1], and provides the generated pilot sub-channel data to a complex conjugate operator 1637. The complex conjugate operator 1637 complex-conjugates the pilot sub-channel data [1, 1, 1, −1]. The complex-conjugated pilot sub-channel data [1, 1, 1, −1] is provided to multipliers 1639. The multipliers 1639 multiply the complex-conjugated pilot sub-channel data by the data blocks output from the associated multipliers 1631, and generate signals [j, j, j, j], [−j, −j, −j, −j], [1, 1, 1, 1] and [−1, −1, −1, −1] in which even the effects of the pilot sub-channel data are completely removed.

As described in conjunction with FIG. 16, when the 4 pilot scrambling codes are used, 4 elements of each of the finally processed pilot sub-channel data blocks [j, j, j, j], [−j, −j, −j, −j], [1, 1, 1, 1] and [−1, −1, −1, −1] have the same values, and the 4 signals have a phase difference of 90 degree from one another. When the transmitter performs scrambling using 4 scrambling codes, selects only a specific sub-channel data block having the minimum PAPR and transmits the selected sub-channel data block, a branch of the specific scrambling code used has a value of [1, 1, 1, 1]. Therefore, the receiver can identify the scrambling code used by the transmitter by determining a branch closest to [1, 1, 1, 1] using the 4 signals. In FIG. 16, since the branch closest to [1, 1, 1, 1] is the third sub-channel data block, the receiver can recognize that the transmitter performed scrambling using the third scrambling code Cd3. A decider and scrambling code information detector 1641 determines the scrambling code used by the transmitter, as described above. When the decider and scrambling code information detector 1641 determines the scrambling code used by the transmitter, a scrambling code generator 1643 selects a scrambling code among the scrambling codes generated by the scrambling code generator 1619 based on the scrambling code information detected by the decider and scrambling code information detector 1641, and provides the selected scrambling code to a multiplier 1645. The multiplier 1645 multiplies the selected scrambling code by the signal output from the channel estimator and equalizer 1615, and provides its output to a demodulator 1647. The demodulator 1647 receives the data output from the multiplier 1645 and demodulates the received data into original data transmitted by the transmitter.

As described in conjunction with FIGS. 14 to 16, in order to reduce the PAPR, the OFDM system scrambles sub-channel data blocks using a plurality of scrambling codes, IFFT-transforms the scrambled sub-channel data blocks, selects a sub-channel data block with the minimum PAPR, and transmits the selected sub-channel data block. Hence, the receiver can recognize the scrambling code used by the transmitter by demodulating a plurality of pilot sub-channels, even though the transmitter has not transmitted separate supplemental information on the scrambling code. Therefore, the fourth embodiment of the present invention need not transmit the separate supplemental information, it is possible to maintain the transmission efficiency. Further, the receiver can extract scrambling code information without performing demodulation on the supplemental information, thus contributing to simplification of the hardware structure of the receiver.

Next, a transmission antenna diversity scheme according to the fifth embodiment of the present invention will be described in detail with reference to FIG. 17.

Figure 17:
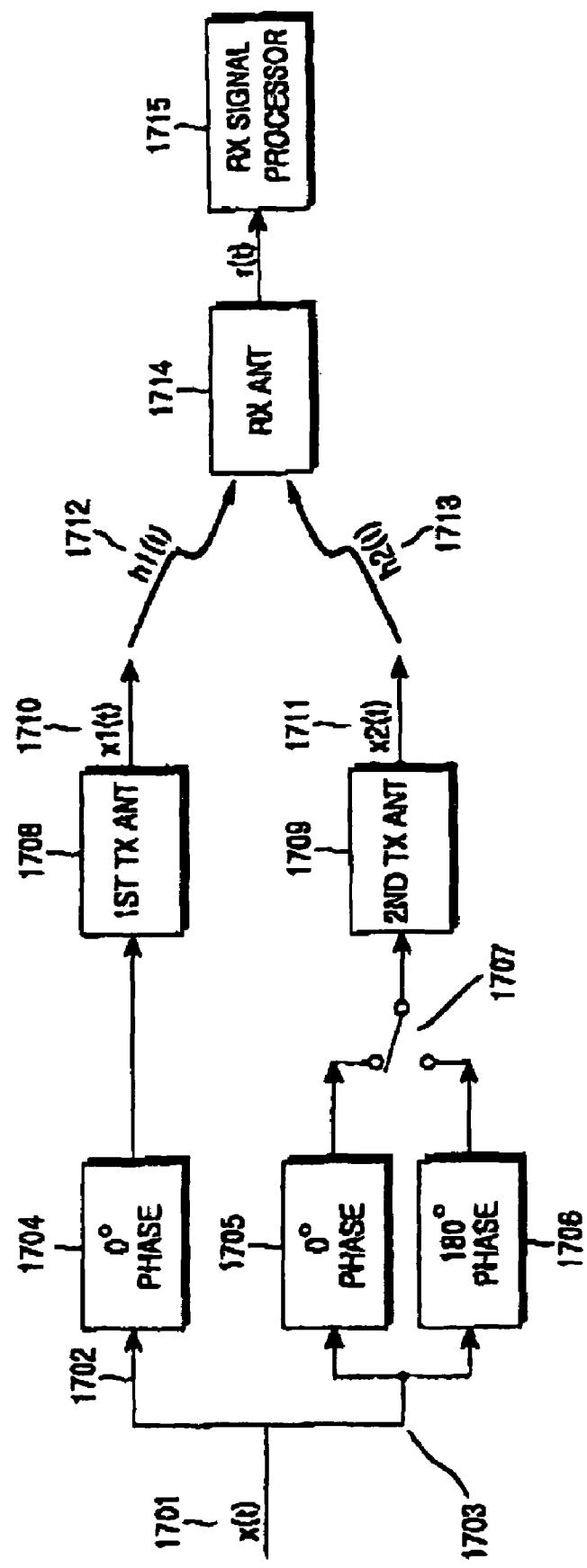
FIG. 17 illustrates a transmission diversity scheme according to an embodiment of the present invention.

FIG. 17 illustrates a transmission diversity scheme according to an embodiment of the present invention. Referring to FIG. 17, an input signal x(t) 1701 is transmitted over two paths. A signal 1702 transmitted over the first path has the same phase as the input signal x(t) 1701 (i.e., has an offset of a zero degree phase 1704), and is transmitted as a transmission signal x1(t) 1710 through a first transmission antenna 1708. A signal 1703 transmitted over the second path is further transmitted over two sub-paths: one signal transmitted over a first sub-path has an in-phase offset of a zero degree phase 1705, and another signal transmitted over a second sub-path has a phase-inversed offset of a 180 degree phase 1706. The signal having the in-phase offset 1705 and the signal having the phase-inversed offset 1706 are alternately selected by a switch 1707 in training symbol period. The signal selected by the switch 1707 is transmitted as transmission signal x2(t) 1711 through a second transmission antenna 1709. The output signal x1(t) 1710 of the first transmission antenna 1708 is received at reception antenna 1714 through a first transmission path h1(t) 1712, and the output signal x2(t) 1711 of the second transmission antenna 1709 is received at the reception antenna 1714 through a second transmission path h2(t) 1713. An output signal r(t) of the reception antenna 1714 is provided to a reception signal processor 1715. The reception signal processor 1715 performs channel estimation and channel compensation on the two transmission paths, and then performs data demodulation.

A detailed description of the transmission diversity scheme will be made herein below. The signals x1(t) 1710 and x2(t) 1711 transmitted through the first and second transmission antennas 1708 and 1709 at time t=t1 and time t=t2, are defined as $x1(t)=x(t)$ at time $t=t1$ $x1(t)=x(t)$ at time $t=t2$ $x2(t)=x(t)$ at time $t=t1$ $x2(t)=-x(t)$ at time $t=t2$ Further, the signals received at the receiver are defined as $r(t)=h1(t)*x1(t)+h2(t)*x2(t)$ at time $t=t1$ (1)

$r(t)=h1(t)*x1(t)+h2(t)*(-x2(t))$ at time $t=t2$ (2)

In Equations (1) and (2), "*" denotes convolution. If it is assumed that the transmitter transmits training symbols in a training symbol period for channel estimation on a transmission frame, the signals x(t1) and x(t2) at time t=t1 and time t=t2 are equal to each other.

That is, in the training symbol period, Equations (1) and (2) are expressed as Equations (3) and (4).

$r_{t1,tr}(t)=h1(t)*X_{tr}(t)+h2(t)*x_{tr}(t)$ (3)

$r_{t2,tr}(t)=h1(t)*X_{tr}(t)+h2(t)*x_{tr}(t)$ (4)

In Equations (3) and (4), the training symbols received at time t=t1 and time t=t2 are the signals transmitted in the training symbol period.

Therefore, Equations (5) and (6) represent transfer functions calculated using Equations (3) and (4).

$R_{t1,tr}=(H1+H2)X_{tr}$ (5)

$R_{t2,tr}=(H1+H2)X_{tr}$ (6)

Hence, transfer functions for the transmission channels over the two paths can be calculated as follows using Equations (5) and (6).

$$H1 = \frac{1}{2}\frac{1}{X_{tr}}(R_{t1,tr} + R_{t2,tr})$$

$$H2 = \frac{1}{2}\frac{1}{X_{tr}}(R_{t1,tr} + R_{t2,tr})$$

Therefore, it is possible to improve the system performance by applying the determined characteristics of the 2 transmission channels to the data symbols received after the training symbol period. As a result, it is possible to estimate the channels over the transmission paths transmitted by the transmitter through 2 transmission antennas by utilizing the transmission antenna diversity scheme according to the fifth embodiment of the present invention. Accordingly, it is possible to improve system performance by processing and demodulating data using the estimation results on the 2 transmission channels.

The present invention has the following advantages.

First, the first embodiment interleaves/deinterleaves data symbols such that a group of error (or damaged) data blocks on an OFDM transmission channel is arranged in a specified one of Reed-Solomon coded symbols. That is, this embodiment improves error correction capability for the frequency selective fading by performing interleaving and deinterleaving such that respective data blocks in one Reed-Solomon symbol should be mapped to the same sub-channels in a plurality of OFDM symbols.

Second, the second embodiment acquires frequency diversity by performing repetitive transmission on a plurality of different OFDM sub-channels in the OFDM system. Hence, the OFDM system provides reliable data communication even in a frequency selective fading environment or a poor environment where an intended/non-intended interference signals exist. Further, it is possible to perform channel mapping such that during repetitive transmission, the associated sub-channels vary depending on the time, thus acquiring additional frequency diversity.

Third, the third embodiment dynamically performs OFDM sub-channel assignment according to a predetermined code pattern or a pattern previously set in the OFDM system depending on the time, rather than statically performing sub-channel mapping, or adaptively performs the sub-channel assignment according to the channel condition. Since the sub-channel frequency is not static but dynamic, it is possible to acquire frequency diversity.

Fourth, in an OFDM system according to the fourth embodiment, a receiver detects a selected sub-channel with the minimized PAPR (Peak-to-Average Power Ratio) using a plurality of scrambling codes, even though a transmitter does not transmit separate supplemental information. The minimization of the PAPR reduces a load of a power amplifier (PA) in the transmitter, making it possible to readily implement the power amplifier. In addition, even though the transmitter does not transmit the supplemental information for the scrambling code, the receiver can detect the sub-channel selected by the transmitter through the pilot sub-channel, thus contributing to simplification of the hardware structure of the transceiver.

Fifth, the fifth embodiment implements transmission antenna diversity for alternating phases in a training symbol period so that the receiver can estimate the characteristics of different transmission channels when diversity is applied to the transmission antennas in the OFDM system. Accordingly, the receiver can perform channel estimation on the respective transmission paths used by the transmitter in transmitting the signals through two antennas, and performs data processing and demodulation using the estimation results on the respective transmission channels, thus improving system performance.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A system for transmitting sub-channels having a minimum peak-to-average power ratio (PAPR) in an orthogonal frequency division multiplexing (OFDM) communication system, the system comprising:
   a pilot scrambling code generator for generating a predetermined number of pilot scrambling codes for identifying pilot sub-channel data blocks among input sub-channel data blocks;
   a scrambling code generator for generating a predetermined number of scrambling codes for scrambling the input sub-channel data blocks;
   a plurality of first multipliers for multiplying the input pilot sub-channel data blocks by a first pilot scrambling code among the pilot scrambling codes, for scrambling;
   a plurality of second multipliers for multiplying the sub-channel data blocks excluding the pilot sub-channel data blocks from the input sub-channel data blocks and data blocks output from the first multipliers by a first scrambling code among the scrambling codes, for scrambling;
   a first inverse fast Fourier transformer (IFFT) for IFFT-transforming the signals output from the second multipliers;
   a plurality of third multipliers for multiplying the input pilot sub-channel data blocks by a second pilot scrambling code among the pilot scrambling codes, for scrambling;
   a plurality of fourth multipliers for multiplying the sub-channel data blocks excluding the pilot sub-channel data blocks from the input sub-channel data blocks and data blocks output from the third multipliers by a second scrambling code among the scrambling codes, for scrambling;
   a second IFFT for IFFT-transforming the signals output from the fourth multipliers;
   first and second PAPR calculators for calculating PAPRs of the sub-channel data blocks output from the first IFFT and the second IFFT, respectively; and
   a selector for selecting sub-channel data blocks output from the first and second IFFTs having a minimum PAPR among the calculated PAPRs, and transmitting the selected sub-channel data blocks over a sub-channel of the OFDM communication system.

2. The system as claimed in claim 1, wherein the number of the pilot scrambling codes is equal to the number of the scrambling codes.

3. The system as claimed in claim 2, wherein the number of the scrambling codes is equal to the number of IFFTs included in the OFDM communication system.

4. The system as claimed in claim 1, wherein when the number of the pilot scrambling codes is four, the four pilot scrambling codes have a ninety degree phase difference from one another.

5. The system as claimed in claim 1, wherein when the number of the pilot scrambling codes is four, the four pilot scrambling codes include a first pilot scrambling code [1, 1, 1, 1], a second pilot scrambling code [−1, −1, −1, −1], a third pilot scrambling code [j, j, j, j], and a fourth pilot scrambling code [−j, −j, −j, −j].

6. A system for receiving sub-channels having a minimum peak-to-average power ratio (PAPR) in an orthogonal frequency division multiplexing (OFDM) communication system, the system comprising:
   a pilot extractor for extracting pilot sub-channel data blocks among input sub-channel data blocks;
   a scrambling code generator for generating a plurality of scrambling codes for scrambling the input sub-channel data blocks;
   a pilot scrambling code extractor for extracting received pilot scrambling codes by descrambling the input sub-channel data blocks with the scrambling codes;
   a plurality of first multipliers for multiplying the extracted pilot sub-channel data blocks by complex-conjugated values of the extracted pilot scrambling codes;
   a pilot scrambling code generator for generating a predetermined number of pilot scrambling codes, the number of generated pilot scrambling codes being equal to the number of pilot scrambling codes transmitted by a transmitting system;

a plurality of second multipliers for multiplying conjugated values of the generated pilot scrambling codes by the values output from the first multipliers;

a scrambling code extractor for extracting scrambling codes by multiplying the data blocks output from the second multipliers by the pilot sub-channel data blocks transmitted by the transmission system; and a demodulator for demodulating the received sub-channel data blocks by scrambling the received sub-channel data blocks with the extracted scrambling codes.

7. A method for transmitting sub-channels having a minimum peak-to-average power ratio (PAPR) in an orthogonal frequency division multiplexing (OFDM) communication system, the method comprising:

(a) generating a predetermined number of pilot scrambling codes for identifying pilot sub-channel data blocks among input sub-channel data blocks, and generating a predetermined number of scrambling codes for scrambling the input sub-channel data blocks;

(b) multiplying the input pilot sub-channel data blocks by a first pilot scrambling code among the pilot scrambling codes, for scrambling;

(c) multiplying the sub-channel data blocks excluding the pilot sub-channel data blocks from the input sub-channel data blocks and pilot sub-channel data blocks scrambled with the first pilot scrambling code by a first scrambling code among the scrambling codes, for scrambling;

(d) IFFT-transforming the signals generated in the step (c);

(e) multiplying the input pilot sub-channel data blocks by a second pilot scrambling code among the pilot scrambling codes, for scrambling;

(f) multiplying the sub-channel data blocks excluding the pilot sub-channel data blocks from the input sub-channel data blocks and data blocks output in the step (b) by a second scrambling code among the scrambling codes, for scrambling;

(g) IFFT-transforming the signals generated in the step (f); and (h) calculating PAPRs of the sub-channel data blocks generated in the steps (d) and (g), respectively, selecting sub-channel data blocks having a minimum PAPR among the calculated PAPRs, and transmitting the selected sub-channel data blocks over a sub-channel of the OFDM communication system.

8. The method as claimed in claim 7, wherein the number of the pilot scrambling codes is equal to the number of the scrambling codes.

9. The method as claimed in claim 8, wherein when the number of the pilot scrambling codes is four, the four pilot scrambling codes have a ninety degree phase difference from one another.

10. The method as claimed in claim 8, wherein when the number of the pilot scrambling codes is four, the four pilot scrambling codes include a first pilot scrambling code [1, 1, 1, 1], a second pilot scrambling code [−1, −1, −1, −1], a third pilot scrambling code [j, j, j, j], and a fourth pilot scrambling code [−j, −j, −j, −j].

11. A method for receiving sub-channels having a minimum peak-to-average power ratio (PAPR) in an orthogonal frequency division multiplexing (OFDM) communication system, the method comprising:

(a) extracting pilot sub-channel data blocks among input sub-channel data blocks;

(b) generating a plurality of scrambling codes for scrambling the input sub-channel data blocks, and extracting received pilot scrambling codes by descrambling the input sub-channel data blocks with the scrambling codes;

(c) multiplying the extracted pilot sub-channel data blocks by complex-conjugated values of the extracted pilot scrambling codes;

(d) generating a predetermined number of pilot scrambling codes, the number of generated pilot scrambling codes being equal to the number of pilot scrambling codes transmitted by a transmitting system, and multiplying conjugated values of the generated pilot scrambling codes by the values generated in the step (c); and (e) extracting scrambling codes by multiplying the data blocks generated in the step (d) by the pilot sub-channel data blocks transmitted by the transmission system, and demodulating the received sub-channel data blocks by scrambling the received sub-channel data blocks with the extracted scrambling codes.

* * * * *